US012610754B2

(12) United States Patent
Yang et al.

(10) Patent No.: US 12,610,754 B2
(45) Date of Patent: Apr. 21, 2026

(54) CHALCOGENIDE-BASED MATERIAL, AND SWITCHING DEVICE AND MEMORY DEVICE THAT INCLUDE THE SAME

(71) Applicant: Samsung Electronics Co., Ltd., Suwon-si (KR)

(72) Inventors: Kiyeon Yang, Seoul (KR); Segab Kwon, Seoul (KR); Hajun Sung, Hwaseong-si (KR); Dongho Ahn, Hwaseong-si (KR); Changseung Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 647 days.

(21) Appl. No.: 17/835,508

(22) Filed: Jun. 8, 2022

(65) Prior Publication Data

US 2023/0091136 A1     Mar. 23, 2023

(30) Foreign Application Priority Data

Sep. 14, 2021    (KR) ........................ 10-2021-0122775

(51) Int. Cl.
| | |
|---|---|
| *H10N 70/00* | (2023.01) |
| *H10B 63/00* | (2023.01) |
| *H10N 70/20* | (2023.01) |

(52) U.S. Cl.
CPC ......... *H10N 70/8825* (2023.02); *H10B 63/24* (2023.02); *H10B 63/84* (2023.02); *H10N 70/231* (2023.02)

(58) Field of Classification Search
None
See application file for complete search history.

(56) References Cited

U.S. PATENT DOCUMENTS

| | | | |
|---|---|---|---|
| 4,887,182 | A | 12/1989 | Sweet |
| 7,638,789 | B2 | 12/2009 | Peters |
| 7,864,567 | B2 | 1/2011 | Gordon et al. |
| 8,982,604 | B2 | 3/2015 | Lee et al. |
| 9,379,321 | B1 | 6/2016 | Chang et al. |

(Continued)

FOREIGN PATENT DOCUMENTS

| | | |
|---|---|---|
| CN | 102923676 A | 2/2013 |
| CN | 103985812 A | 8/2014 |

(Continued)

OTHER PUBLICATIONS

Sharda Sundanda et al.: "Thermal stability and crystallization kinetics of quaternary Sb—Se—Ge—In chalcogenide glasses", Journal of Alloys and Compounds, Elsevier Sequoia, Lausanne, Ch, vol. 611, May 22, 2014, pp. 96-99 (Year: 2014).*

(Continued)

*Primary Examiner* — Daniel Whalen
(74) *Attorney, Agent, or Firm* — HARNESS, DICKEY & PIERCE, P.L.C.

(57) ABSTRACT

Provided are a chalcogenide-based material, and a switching element and a memory device that include the same. The chalcogenide-based material includes: a chalcogenide material and a dopant. The chalcogenide material includes Ge, Sb, and Se. The dopant includes at least one metal or metalloid element selected from In, Al, Sr, and Si, an oxide of the metal or metalloid element, or a nitride of the metal or metalloid element.

34 Claims, 9 Drawing Sheets

(56) References Cited

U.S. PATENT DOCUMENTS

| | | | |
|---|---|---|---|
| 9,704,921 B2 | 7/2017 | Kim et al. | |
| 9,748,311 B2 | 8/2017 | Fantini et al. | |
| 10,062,840 B2 | 8/2018 | Sim et al. | |
| 10,084,017 B2 | 9/2018 | Ohba et al. | |
| 10,163,977 B1 | 12/2018 | Fantini et al. | |
| 10,186,552 B2 | 1/2019 | Choi et al. | |
| 10,374,009 B1 | 8/2019 | Cheng et al. | |
| 10,634,938 B2 | 4/2020 | Fang et al. | |
| 10,868,245 B1 | 12/2020 | Bai et al. | |
| 2015/0074326 A1 | 3/2015 | Castro | |
| 2017/0023700 A1 | 1/2017 | Bergey | |
| 2017/0316822 A1 | 11/2017 | Sei et al. | |
| 2019/0148456 A1 | 5/2019 | Wu et al. | |
| 2020/0152264 A1 | 5/2020 | Wu et al. | |
| 2020/0365657 A1 | 11/2020 | Lee et al. | |
| 2020/0365801 A1* | 11/2020 | Yu | H10N 70/026 |
| 2020/0395410 A1 | 12/2020 | Grobis et al. | |

FOREIGN PATENT DOCUMENTS

| | | | |
|---|---|---|---|
| CN | 108922960 A | 11/2018 |
| EP | 3660932 A1 | 6/2020 |
| KR | 2013/0142518 A | 12/2013 |
| KR | 2020-0132366 A | 11/2020 |
| KR | 2021-0027306 A | 3/2021 |

OTHER PUBLICATIONS

European Office Action dated Feb. 6, 2024 for corresponding European Patent Application No. 22180683.9.

Sharda Sunanda et al: "Thermal stability and crystallization kinetics of quaternary Sb—Se—Ge—In chalcogenide glasses", Journal of Alloys and Compounds, Elsevier Sequoia, Lausanne, Ch, vol. 611, May 22, 2014 (May 22, 2014), pp. 96-99, XP028871361, ISSN: 0925-8388, DOI: 10.1016/J.JALLCOM.2014.05.097.

Sharda, S. et al., 'New Quaternary Sb—Se—Ge—In Chalcogenide Glasses: Linear and Nonlinear Optical Properties' *Journal of Electronic Materials*, vol. 42, No. 12, 2013, pp. 3367-3372, XP093035439.

Extended European Search Report dated Apr. 11, 2023, issued in corresponding European Patent Application No. 22180683.9.

A. Verdy et al., 'Optimized Reading Window for Crossbar Arrays Thanks to Ge—Se—Sb—N—based OTS Selectors' *IEEE*, 2018.

Sang-Yeol Shin et al., 'The effect of doping Sb on the electronic structure and the device characteristics of Ovonic Threshold Switches based on Ge—Se' *Scientific Reports*, vol. 4, Article 7099, Nov. 2014.

S. Lavizzari et al., "Structural relaxation in chalcogenide-based phase change memories (PCMs): from defect-annihilation kinetic to device-reliability prediction", European Phase Change and Ovonic Symposium, Jan. 2008.

* cited by examiner

CHALCOGENIDE-BASED MATERIAL, AND SWITCHING DEVICE AND MEMORY DEVICE THAT INCLUDE THE SAME

CROSS-REFERENCE TO RELATED APPLICATION

This application is based on and claims priority under 35 U.S.C. § 119 to Korean Patent Application No. 10-2021-0122775, filed on Sep. 14, 2021, in the Korean Intellectual Property Office, the disclosure of which is incorporated by reference herein in its entirety.

BACKGROUND

1. Field

The present disclosure relates to a chalcogenide-based material, and a switching device and/or a memory device that include the same.

2. Description of the Related Art

With the development of compact and high-performance electronic devices in recent years, there is a demand for memory devices capable of storing information in various electronic devices such as computers and portable communication devices. Such memory devices may include resistive random-access memory (RRAM), phase-change random access memory (PRAM), and magnetic random-access memory (MRAM), in which data is stored using properties of switching between different resistance states in accordance with voltage or current applied thereto. Such a memory device may require a switching material layer that allows selective addressing to a material layer capable of storing data. For the switching material layer, a chalcogenide switching material including Ge, As, and Se has been used. However, the use of As may cause a problem of environmental pollution due to its risk of toxicity.

There may be a need for a chalcogenide-based material of a novel composition, and a switching device and a memory device that include the chalcogenide-based material.

SUMMARY

One or more embodiments include a chalcogenide-based material having an As-free novel composition.

One or more embodiments include a switching device that uses the chalcogenide-based material in a switching material layer to have enhanced structural stability and/or suppressed threshold voltage drift.

One or more embodiments include a memory device that uses the chalcogenide-based material in a switching material layer to have enhanced structural stability and suppressed threshold voltage drift.

Additional aspects will be set forth in part in the description which follows and, in part, will be apparent from the description, or may be learned by practice of the presented embodiments of the disclosure.

According to one or more embodiments, a chalcogenide-based material including: a chalcogenide material including Ge, Sb, and Se, and a dopant. The dopant may include at least one metal or metalloid element selected from among In, Al, Sr, and Si, an oxide of the metal or metalloid element, or a nitride of the metal or metalloid element.

According to one or more embodiments, a switching device may include a first electrode layer; a second electrode layer facing the first electrode layer; and a switching material layer between the first electrode layer and the second electrode layer. The switching material layer may include a chalcogenide-based switching material and the chalcogenide-based switching material may include a chalcogenide material including Ge, Sb, and Se, and a dopant. The dopant may include at least one metal or metalloid element selected from In, Al, Sr, and Si, an oxide of the metal or metalloid element, or a nitride of the metal or metalloid element.

According to one or more embodiments, a memory device may include: a first electrode layer; a switching material layer on the first electrode layer; a variable resistance layer on the switching material layer; and a second electrode layer on the variable resistance layer. The switching material layer may include a chalcogenide-based switching material and the chalcogenide-based switching material may include a chalcogenide material including Ge, Sb, and Se, and a dopant. The dopant may include at least one metal or metalloid element selected from In, Al, Sr, and Si, an oxide of the metal or metalloid element, or a nitride of the metal or metalloid element.

According to one or more embodiments, a memory device may include a first electrode line layer including a plurality of first electrode lines that extend in a first direction and are spaced apart each other; a second electrode line layer on the first electrode line layer and including a plurality of second electrode lines that extend in a second direction and are spaced apart from each other, the second direction being different than the first direction, and the plurality of first electrode lines and the plurality of second electrode lines crossing each other to form a plurality of intersections; and a plurality of memory cells electrically connected between the plurality of first electrode lines and the plurality of second electrode lines at the plurality of intersections. The plurality of memory cells each may include a variable resistance layer and a switching material layer electrically connected to the variable resistance layer. The switching material layer may include a chalcogenide-based switching material. The chalcogenide-based switching material may include a chalcogenide material including Ge, Sb, and Se, and a dopant. The dopant may include at least one metal or metalloid element selected from In, Al, Sr, and Si, an oxide of the metal or metalloid element, or a nitride of the metal or metalloid element.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
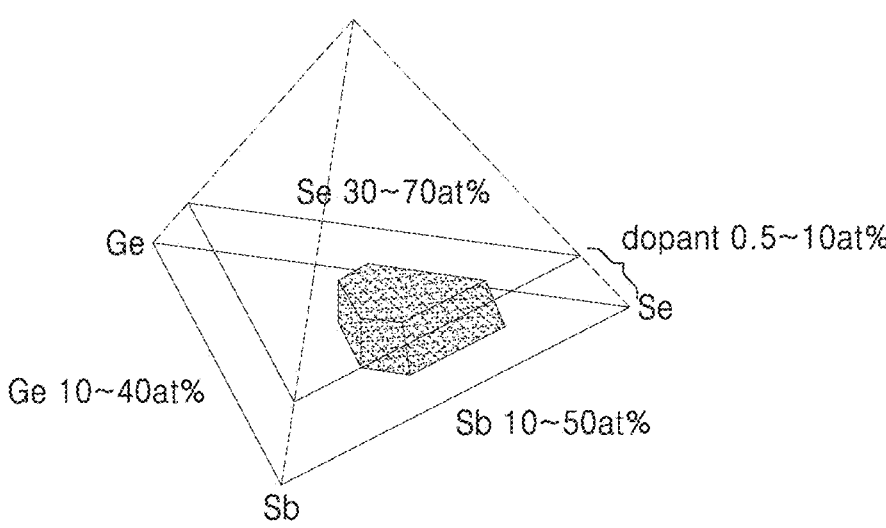
FIG. 1 is a three-dimensional compositional diagram showing composition regions of a chalcogenide-based material according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

Hereinafter, embodiments of a chalcogenide-based material, and a switching element and a memory device which include the same will be described in detail. Accordingly, it should be apparent to those skilled in the art that the following description of various embodiments of the present disclosure is provided for illustration purpose only and not for the purpose of limiting the present disclosure as defined by the appended claims and their equivalents.

Hereinafter, an element referred to as being "above" or "on" another element may be directly on the other element in contact therewith or intervening elements may also be present. As used herein, the singular forms "a", "an" and "the" are intended to include the plural forms as well, unless the context clearly indicates otherwise. Throughout the specification, the term "include" is intended to indicate that an element do not preclude the other elements but further add and/or intervene another element, unless otherwise stated. As used herein, the term "combination" includes a mixture, an alloy, a reaction product, and the like unless otherwise stated. It will be understood that, although the terms first, second, third, fourth, etc. may be used herein to describe various components, these components should not be limited by these terms. These terms are only used to distinguish one component from another. The term "or" refers to "and/or" unless otherwise stated.

As used herein, the term "connected" may refer to being connected directly or indirectly, or via a communication network. As used herein, the terms "an embodiment", "embodiments", and the like indicate that elements described with regard to an embodiment are included in at least one embodiment described in this specification and may or may not present in other embodiments. In addition, it may be understood that the described elements are combined in any suitable manner in various embodiments.

Unless otherwise defined, technical and scientific terms used herein have the same meaning as commonly understood by one or ordinary skill in the art to which this application belongs. All patents, patent applications, and other cited references are incorporated herein by reference in their entirety. However, in the event of any conflict or inconsistency between terms used herein and terms of the cited references, the terms used in this specification take precedence over the terms of the cited references. While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modification, variations, improvements, and substantial equivalents.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

In general, an ovonic threshold switching (OTS) material includes arsenic (As). For example, an OTS material may include Ge—As—Te—Si, Ge—As—Se, Ge—As—Te, or the like. Arsenic helps to maintain the amorphous state of an OTS material, and thus limits and/or prevents a phenomenon of irreversible switching due to a phase change. However, since As materials are toxic and have many restrictions on their use, research is ongoing for replacement with other materials.

Research has been conducted on Ge—Sb—Te, Ge—P—Se, Ge—Te, Ge—Se, and the like as As-free chalcogenide-based switching materials. Of these materials, the Ge—Sb—Te material is excellent in amorphous stability and electrical characteristics, but has lower structural stability compared to As-containing chalcogenide-based switching materials. This results from that Sb atom has a larger size than As atom and thus easily forms a crystalline phase. Due to such a low structural stability, Ge—Sb—Se— based switching elements and memory devices have a relatively large threshold voltage drift caused by structural relaxation.

Considering such problems, the inventors of the present disclosure proposes, as below, a chalcogenide-based material having a novel composition, and a switching element and a memory device that include the same.

A chalcogenide-based material according to an embodiment may include: a chalcogenide material including Ge, Sb, and Se; and a dopant, wherein the dopant includes at least one metal or metalloid element selected from In, Al, Sr, and Si, an oxide of the metal or metalloid element, or a nitride of the metal or metalloid element.

FIG. 1 is a three-dimensional compositional diagram showing composition regions of a chalcogenide-based material according to an embodiment.

Referring to FIG. 1, the chalcogenide-based material according to an embodiment has a composition including about 10 at % to about 40 at % of Ge element, about 10 at % to about 50 at % of Sb element, about 30 at % to about 80 at % of Se element, and about 0.5 at % to about 10 at % of a dopant element. In the present application, at % may refer to atomic percentage.

For example, the chalcogenide-based material may include a compound represented by Formula 1:

$$Ge_aSb_bSe_cM_d \qquad \text{[Formula 1]}$$

wherein, in Formula 1,

M may be at least one metal or metalloid element selected from In, Al, Sr, and Si, 10 at %≤a≤40 at %, 10 at %≤b≤50 at %, 30 at %≤c≤80 at %, 0.5 at %≤d≤10 at %, and a+b+c+d=100 at %.

For example, in Formula 1, 10 at %≤a≤30 at %, 10 at %≤b≤30 at %, and 50 at %≤c≤80 at %.

For example, in Formula 1, 10 at %≤a≤25 at %, 10 at %≤b≤25 at %, and 55 at %≤c≤80 at %.

For example, the chalcogenide-based material may include a compound represented by Formula 2:

$$Ge_{a1}Sb_{b1}Se_{c1}(M1_xO_y)_{d1} \qquad \text{[Formula 2]}$$

wherein, in Formula 2,

M1 may be at least one metal or metalloid element selected from In, Al, Sr, and Si, 10 at %≤a1≤40 at %, 10 at %≤b1≤50 at %, 30 at %≤c1≤80 at %, 5 at %≤d1≤10 at %, 30 at %≤x≤70 at %, 30 at %≤y≤70 at %, a1+b1+c1+d1=100 at %, and x+y=100 at %.

For example, the chalcogenide-based material may include a compound represented by Formula 3:

$$Ge_{a2}Sb_{b2}Se_{c2}(M2_{x1}N_{y1})_{d2} \qquad \text{[Formula 3]}$$

wherein, in Formula 3,

M2 may be at least one metal or metalloid element selected from In, Al, Sr, and Si, 10 at %≤a2≤40 at %, 10 at %≤b2≤50 at %, 30 at %≤c2≤80 at %, 5 at %≤d2≤10 at %, 30 at %≤x1≤70 at %, 30 at %≤y1≤70 at %, a2+b2+c2+d2=100 at %, and x1+y1=100 at %.

For example, the chalcogenide-based material may include at least one selected from $Ge_{20}Sb_{20}Se_{60}In_5$, $Ge_{20}Sb_{20}Se_{60}In_{10}$, $Ge_{20}Sb_{20}Se_{60}Al_5$, $Ge_{20}Sb_{20}Se_{60}Al_{10}$, $Ge_{20}Sb_{20}Se_{60}Sr_5$, $Ge_{20}Sb_{20}Se_{60}Sr_{10}$, $Ge_{20}Sb_{20}Se_{60}Si_5$, $Ge_{20}Sb_{20}Se_{60}Si_{10}$, $Ge_{20}Sb_{20}Se_{60}(In_{x3}Al_{y3})_5$, $Ge_{20}Sb_{20}Se_{60}(In_{x3}Al_{y3})_{10}$, $Ge_{20}Sb_{20}Se_{60}(In_{x3}Sr_{y3})_5$, $Ge_{20}Sb_{20}Se_{60}(In_{x3}Sr_{y3})_{10}$, $Ge_{20}Sb_{20}Se_{60}(In_{x3}Si_{y3})_5$, $Ge_{20}Sb_{20}Se_{60}(In_{x3}Si_{y3})_{10}$, $Ge_{20}Sb_{20}Se_{60}(Al_{x3}Sr_{y3})_5$, $Ge_{20}Sb_{20}Se_{60}(Al_{x3}Sr_{y3})_{10}$, $Ge_{20}Sb_{20}Se_{60}(Al_{x3}Si_{y3})_5$, $Ge_{20}Sb_{20}Se_{60}(Al_{x3}Si_{y3})_{10}$, $Ge_{20}Sb_{20}Se_{60}(Sr_{x3}Si_{y3})_5$, $Ge_{20}Sb_{20}Se_{60}(Sr_{x3}Si_{y3})_{10}$, $Ge_{20}Sb_{20}Se_{60}(In_{x2}O_{y2})_5$, $Ge_{20}Sb_{20}Se_{60}(In_{x2}O_{y2})_{10}$, $Ge_{20}Sb_{20}Se_{60}(Al_{x2}O_{y2})_5$, $Ge_{20}Sb_{20}Se_{60}(Al_{x2}O_{y2})_{10}$, $Ge_{20}Sb_{20}Se_{60}(Sr_{x2}O_{y2})_5$, $Ge_{20}Sb_{20}Se_{60}(Sr_{x2}O_{y2})_{10}$, $Ge_{20}Sb_{20}Se_{60}(Si_{x2}O_{y2})_5$, $Ge_{20}Sb_{20}Se_{60}(Si_{x2}O_{y2})_{10}$, $Ge_{20}Sb_{20}Se_{60}(In_{x2}N_{y2})_5$, $Ge_{20}Sb_{20}Se_{60}(In_{x2}N_{y2})_{10}$, $Ge_{20}Sb_{20}Se_{60}(Al_{x2}N_{y2})_5$, $Ge_{20}Sb_{20}Se_{60}(Al_{x2}N_{y2})_{10}$, $Ge_{20}Sb_{20}Se_{60}(Sr_2N_{y2})_5$, $Ge_{20}Sb_{20}Se_{60}(Sr_2N_{y2})_{10}$, $Ge_{20}Sb_{20}Se_{60}(Si_{x2}N_{y2})_5$, and $Ge_{20}Sb_{20}Se_{60}(Si_{x2}N_{y2})_{10}$, wherein 30 at %≤x2≤70 at %, 30 at %≤y2≤70 at %, and x2+y2=100 at %, and wherein 0 at %<x3<100 at %, 0 at %<y3<100 at %, and x3+y3=100 at %.

When the chalcogenide-based material is used in a switching element, there may be a reduction in Se—Se homopolar bonds that play an important role in structural relaxation occurring with aging. Instead, bonds between Se-dopant metal or metalloid atoms may increase. This may cause the chalcogenide-based material to have enhanced structural stability and may limit and/or suppress a threshold voltage drift.

Figure 2:
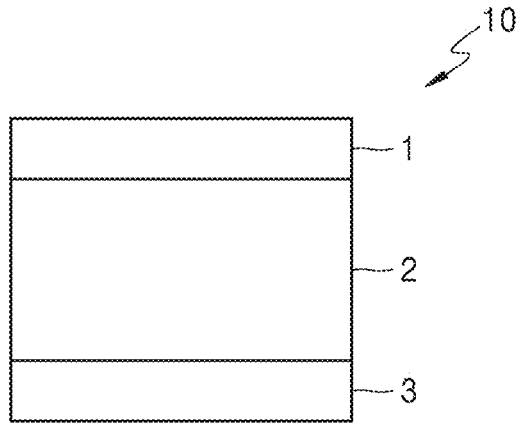
FIG. 2 is a schematic view of a switching element according to an embodiment.

FIG. 2 is a schematic view of a switching element 10 according to an embodiment.

Referring to FIG. 2, the switching element 10 may include a first electrode layer 1, a second electrode layer 3 arranged to face the first electrode layer 1, and a switching material layer 2 between the first electrode layer 1 and the second electrode layer 3, wherein the switching material layer 2 may include the chalcogenide-based material as described above.

The first electrode layer 1 and the second electrode layer 3 serve as a path of a current. The first electrode layer 1 and the second electrode layer 3 may be formed at both ends of switching material layer 2, respectively. In other embodiments, the first electrode layer 1 and the second electrode layer 3 may optionally be formed of conductive materials. For example, the conductive materials may each be a metal, a conductive metal nitride, a conductive metal oxide, or a combination thereof. For example, the conductive materials may each include at least one selected from carbon (C), a titanium nitride (TiN), a titanium silicon nitride (TiSiN), a titanium carbon nitride (TiCN), a titanium carbon silicon nitride (TiCSiN), a titanium aluminum nitride (TiAlN), tantalum (Ta), a tantalum nitride (TaN), tungsten (W), and a tungsten nitride (WN), but are not limited thereto.

The switching material layer 2 may be a current control layer capable of controlling flow of a current.

The switching material layer 2 may include a chalcogenide-based switching material and the chalcogenide-based switching material may include: a chalcogenide material including Ge, Sb, and Se; and a dopant, and the dopant may include at least one metal or metalloid element selected from In, Al, Sr, and Si, an oxide of the metal or metalloid element, or a nitride of the metal or metalloid element. The chalcogenide-based switching material may include any one of compounds represented by Formulae 1 to 3, and have the composition according to any of the embodiments described above.

The switching material layer 2 may be formed by deposition, for example, by physicochemical deposition.

In one or more embodiments, the switching material layer 2 may be formed by physical vapor deposition using at least one target which includes: a chalcogenide material including Ge, Sb, and Se; and a dopant which is at least one metal or metalloid element selected from In, Al, Sr, and Si, an oxide of the metal or metalloid element, or a nitride of the metal or metalloid element. In an embodiment, the at least one target may include a first target that includes: both a chalcogenide material including Ge, Sb, and Se; and a dopant including at least one metal or metalloid element selected from In, Al, Sr, and Si, an oxide of the metal or metalloid element, or a nitride of the metal or metalloid element. In other embodiments, the at least one target may include: a first target including Ge, Sb, and Se elements; and a second target including a dopant including at least one metal or metalloid element selected from In, Al, Sr, and Si, an oxide of the metal or metalloid element, or a nitride of the metal or metalloid element.

In other embodiments, the switching material layer may be formed by chemical vapor deposition (CVD) or atomic layer deposition (ALD) using a plurality of sources that include: a chalcogenide material including Ge, Sb, and Se; and a dopant including at least one metal or metalloid element selected from In, Al, Sr, and Si, an oxide of the metal or metalloid element, or a nitride of the metal or metalloid element.

In other embodiments, the switching material layer 2 may be formed to have a small thickness by co-sputtering deposition. A thickness of the switching material layer 2 may be about 5 nm to about 50 nm, for example, about 5 nm to about 30 nm.

The chalcogenide-based switching material of the switching material layer 2 may exhibit an ovonic threshold switching (OTS) material characteristic.

When a voltage less than a threshold voltage is applied across the first electrode layer 1 and the second electrode layer 3, the switching material layer 2 maintains a high resistance state with little current flowing, and when a voltage higher than the threshold voltage is applied across the first electrode layer 1 and the second electrode layer 3, the switching material layer 2 becomes a low resistance state and a current may begin to flow therethrough. In addition, when the current flowing through the switching material layer 2 falls to below a holding current, the switching material layer 2 may change into a high resistance state.

The structural stability of the chalcogenide-based switching material of the switching material layer 2 may be enhanced, and thus, the switching element 10 may implement stable switching characteristics with a limited and/or suppressed threshold voltage drift. This results from bonding of the dopant with at least portion of Se atom in the chalcogenide-based switching material. The chalcogenide-based switching material may be an amorphous material in which at least some Se—Se homopolar bonds are substituted with Se-M bonds, wherein M may be a metal or metalloid element of In, Al, Sr, or Si.

Figure 3A:
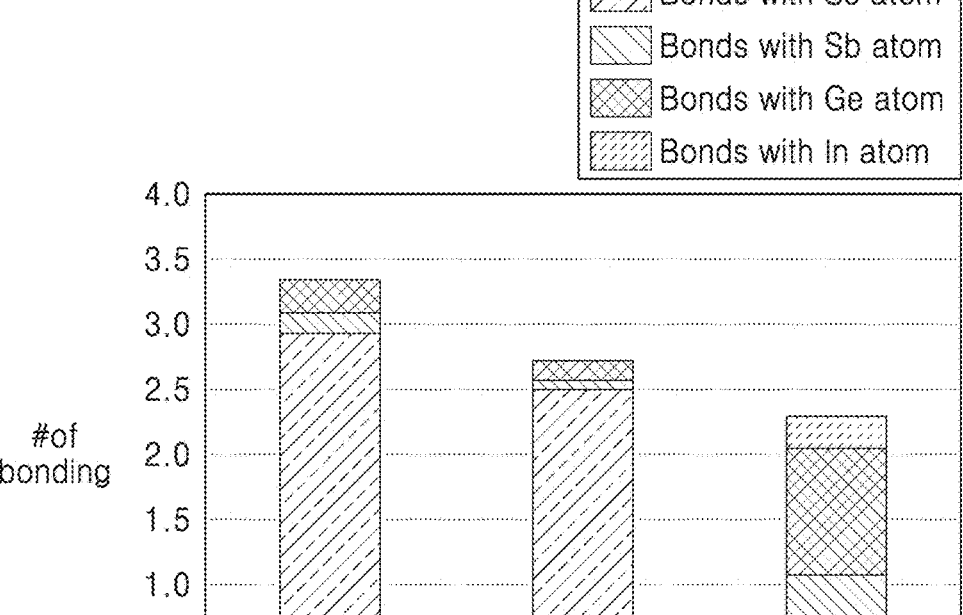
FIGS. 3A and 3B show the results of extended x-ray absorption fine structure (EXAFS) analysis of the bonding structures of elements in $Ge_{20}Sb_{20}Se_{60}In_5$ and $Ge_{20}Sb_{20}Se_{60}In_{10}$ chalcogenide-based switching materials of switching elements according to embodiments.
Figure 3B:
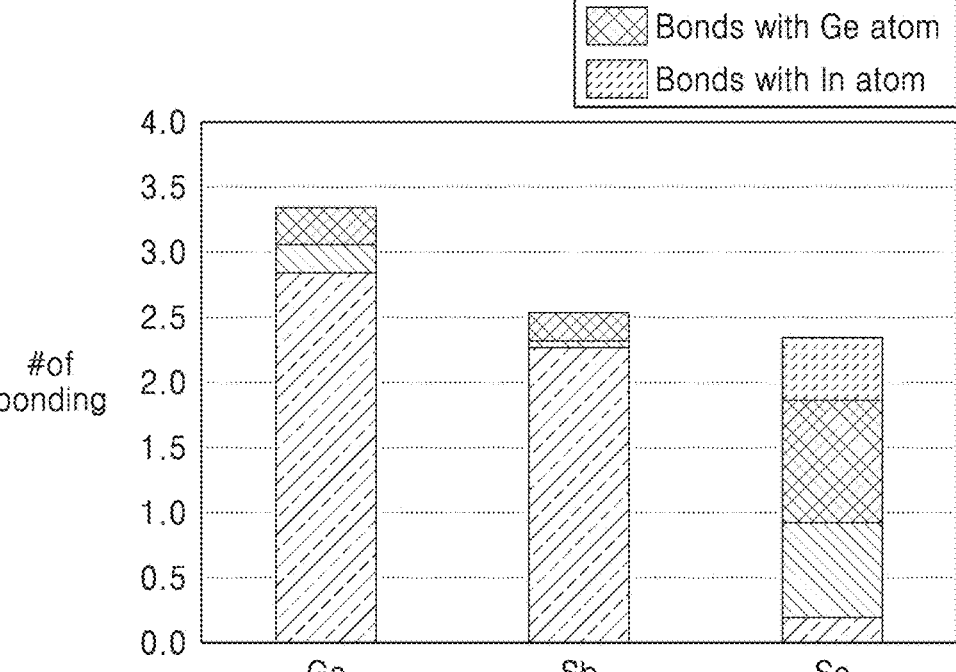

FIGS. 3A and 3B show the results of extended x-ray absorption fine structure (EXAFS) analysis of the bonding structures of elements in $Ge_{20}Sb_{20}Se_{60}In_5$ and $Ge_{20}Sb_{20}Se_{60}In_{10}$ chalcogenide-based switching materials of switching elements according to embodiments. In FIGS. 3A and 3B, the bar on the left represents the numbers of Se atoms, Sb atoms, and Ge atoms that bind with one Ge atom. In FIGS. 3A and 3B, the bar in the middle represents the numbers of Se atoms, Sb atoms, and Ge atoms that bind with one Sb atom. In FIGS. 3A and 3B, the bar on the right represents the numbers of Se atoms, Sb atoms, Ge atoms, and dopant atoms bound to one Se atom.

Referring to FIG. 3A, for the $Ge_{20}Sb_{20}Se_{60}In_5$ chalcogenide-based switching material, the number of Se atoms that bind with one Ge atom was 2.9, the number of Sb atoms that bind with one Ge atom was 0.2, the number of Ge atoms that bind with one Ge atom was 0.3. For the $Ge_{20}Sb_{20}Se_{60}In_5$ chalcogenide-based switching material, the number of Se atoms that bind with one Sb atom was 2.5, the number of Sb atoms that bind with one Sb atom was 0.05, and the number of Ge atoms that bind with one Sb atom was 0.2. For the $Ge_{20}Sb_{20}Se_{60}In_5$ chalcogenide-based switching material, the number of Se atoms that bind with one Se atom was 0.23, the number of Sb atoms that bind with one Se atom was 0.84, the number of Ge atoms that bind with one Se atom was 0.95, and the number of In atoms that bind with one Se atom was 0.35.

Referring to FIG. 3B, for the $Ge_{20}Sb_{20}Se_{60}In_{10}$ chalcogenide-based switching material, the number of Se atoms that bind with one Ge atom was 2.85, the number of Sb atoms that bind with one Ge atom was 0.18, and the number of Ge atoms that bind to one Ge atom was 0.28. For the $Ge_{20}Sb_{20}Se_{60}In_{10}$ chalcogenide-based switching material, the number of Se atoms that bind with one Sb atom was 2.31, the number of Sb atoms that bind with one Sb atom was 0.04, and the number of Ge atoms that bind with one Sb atom was 0.17. For the $Ge_{20}Sb_{20}Se_{60}In_{10}$ chalcogenide-based switching material, the number of Se atoms that bind with one Se atom was 0.16, the number of Sb atoms that bind with one Se atom was 0.78, the number of Ge atoms that bind with one Se atom was 0.9, and the number of In atoms that bind with one Se atom was 0.48.

From FIGS. 3A and 3B, for the $Ge_{20}Sb_{20}Se_{60}In_5$ and $Ge_{20}Sb_{20}Se_{60}In_{10}$ chalcogenide-based switching materials of the switching elements according to embodiments, it can be confirmed that In atoms were bound to Se atoms, and as the amount of In atoms increased from 5 at % to 10 at %, the number of bonds between Se atoms reduced, and the number of bonds between Se atoms and In atoms increased. These analysis results are considered to be due to a higher binding energy of Se-M bonds compared to Se—Se homopolar bonds. According to Practical Electron Microscopy and Database (Yougui Liao, Second Edition, 2006), the binding energy of Se—Se homopolar bonds is 172 kJ/mol. In comparison to this, the Se—In binding energy is 245 kJ/mol, the Se—Al binding energy is 318 kJ/mol, the Se—Sr binding energy is 251 kJ/mol, and the Se—Si binding energy is 538 kJ/mol. Accordingly, the chalcogenide-based switching materials may have enhanced structural stability even with aging. The switching element 10 may have a reduced threshold voltage drift, compared to the chalcogenide switching material consisting of Ge, Sb, and Se.

Figure 4:
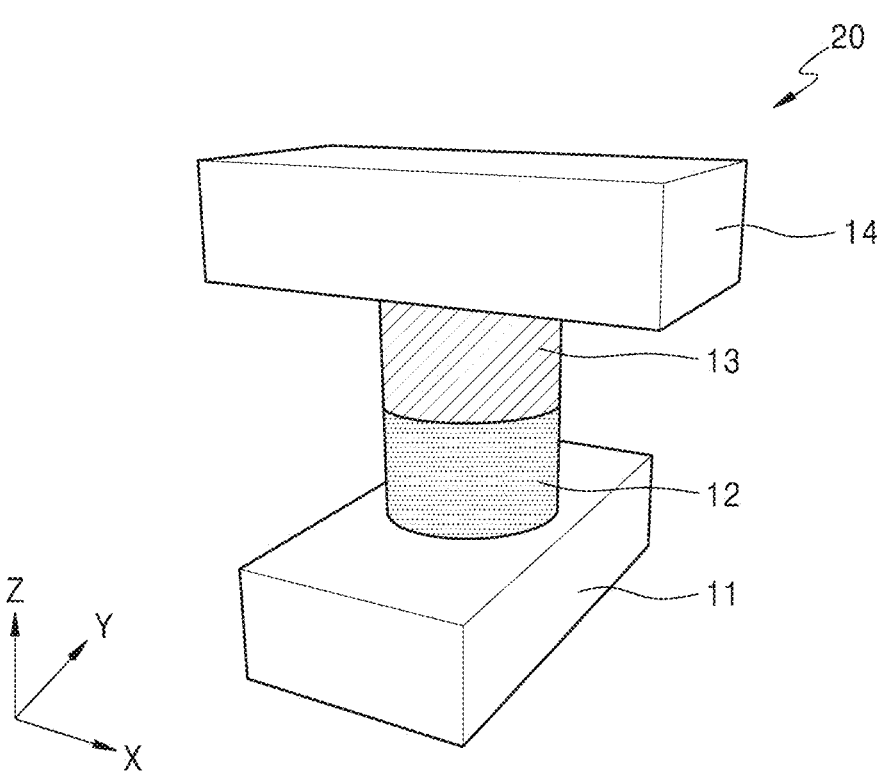
FIG. 4 is a perspective view of a memory device according to an embodiment.
Figure 5:
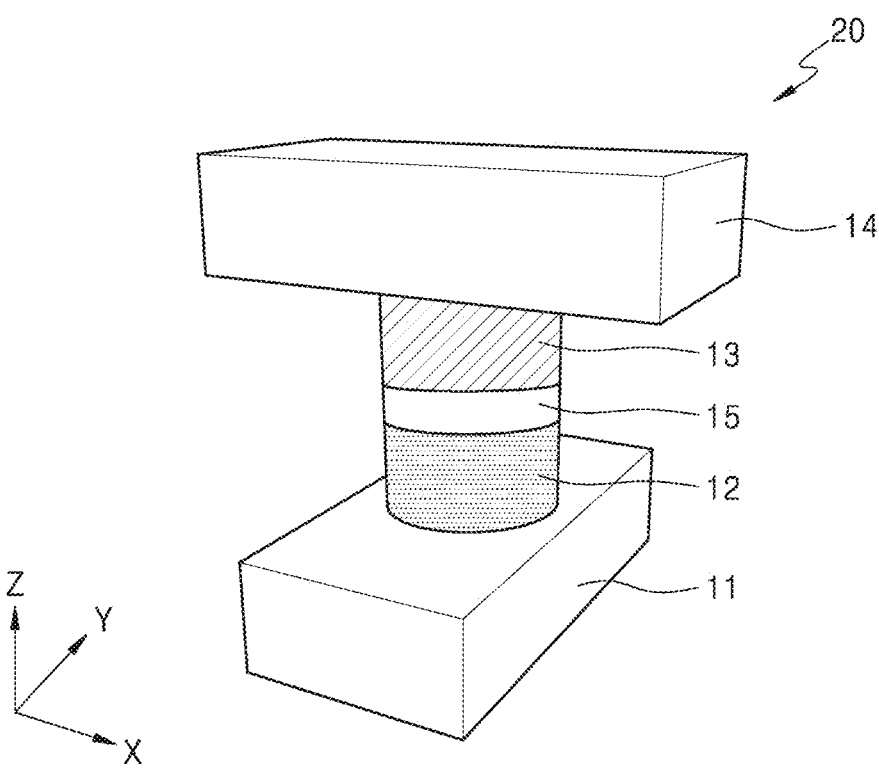
FIG. 5 is a perspective view of a memory device according to another embodiment.

FIG. 4 is a perspective view of a memory device 20 according to an embodiment. FIG. 5 is a perspective view of a memory device 20 according to another embodiment.

Referring to FIG. 4, the memory device 20 may include a first electrode layer 11, a switching material layer 12 arranged on the first electrode layer 11, a variable resistance layer 13 arranged on the switching material layer 12, and a second electrode layer 14 arranged on the variable resistance layer 13, and the switching material layer 12 may include a chalcogenide-based material as described above. Referring to FIG. 5, the memory device 10 may further include a third electrode layer 15 between the switching material layer 12 and the variable resistance layer 13. The first electrode layer 11 and the second electrode layer 14 may be formed of the same conductive material materials as those of the first electrode layer 1 and the second electrode layer 3. The third electrode layer 15 may include a conductive material capable of generating sufficient heat in a phase change material of the variable resistance layer 13, which will be described later, without reacting with the memory device 20. The third electrode layer 15 may be formed of the same conductive material as those of the first electrode layer 1 and the second electrode layer 3, or may additionally include high-melting-point metals, or nitrides thereof such as TaSiN, TaAlN, WSi, TiW, MoN, NbN, TiBN, ZrSiN, WSiN, WBN, ZrAlN, MoAlN, TiAl, TiON, TiAlON, WON, TaON, tantalum carbon nitride (TaCN), or combinations thereof. However, embodiments are not limited thereto.

The variable resistance layer 13 may include a phase change material that reversibly changes between amorphous and crystalline states according to heating time. The phase change material may be in a high resistance state in an amorphous phase and a low resistance state in a crystalline phase. By defining the high resistance as '0' and the low resistance state as '1,' data may be stored in the memory device 20. Examples of such a phase change material may include a chalcogenide-based material. The chalcogenide-based material may include a chalcogenide-based material having a different composition from the chalcogenide-based switching material. Examples of the chalcogenide-based material used in the variable resistance layer 13 may include a GeSbTe(GST)-based material. For example, the GeSbTe (GST)-based material may be $Ge_2Sb_2Te_5$, $Ge_2Sb_2Te_7$, $GeSb_2Te_4$, or $GeSb_4Te_7$. However, embodiments are not limited thereto, and the phase change material may include a chalcogenide material including two or more elements selected from silicon (Si), germanium (Ge), antimony (Sb), tellurium (Te), bismuth (Bi), indium (In), tin (Sn), and selenium (Se). The elements constituting the chalcogenide material may have various stoichiometric ratios.

The memory device 20 includes a chalcogenide-based material as described above in the switching material layer 12, and thus, may have enhanced structural stability and a limited and/or suppressed threshold voltage drift.

Figure 6:
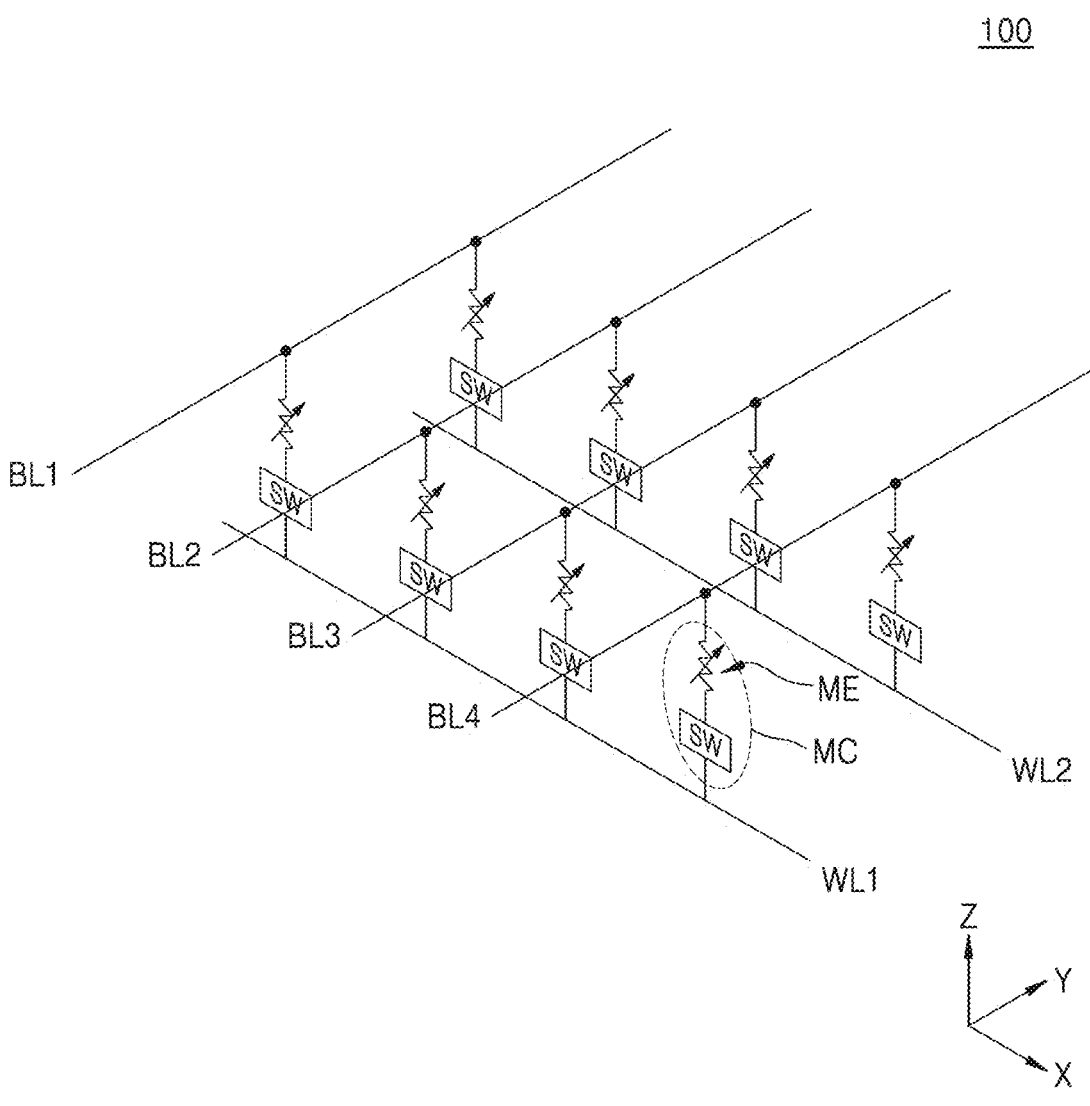
FIG. 6 is an equivalent circuit diagram of a memory device according to another embodiment.

FIG. 6 is an equivalent circuit diagram of a memory device 100 according to another embodiment.

Referring to FIG. 6, the memory device 100 may include wordlines WL1 and WL2 that extend in a first direction (X-direction) and are spaced from one another in a second direction (Y direction) perpendicular to the first direction. In addition, the memory device 100 may include bitlines BL1, BL2, BL3, and BL4 which are separated from the word lines WL1 and WL2 in a third direction (Z direction) and extend in the second direction.

Memory cells MC may be arranged between the bitlines BL1, BL2, BL3, and BL4 and the wordlines WL1 and WL2. In particular, the memory cells MC may be arranged at the crossing points of the bitlines BL1, BL2, BL3, and BL4 and the wordlines WL1 and WL2, and may include a variable resistance layer ME for information storage and a switching material layer SW for selecting a memory cell. The switching material layer SW may be also referred to as a selection element layer, a switching element layer, or an access element layer. Various voltage signals or current signals may be provided through the wordlines WL1 and WL2 and the bitlines BL1, BL2, BL3, and BL4, and data are written to or read from a memory cell selected according to a voltage signal or current signal, and the other unselected memory cells are prohibited from being written to or read from.

The memory cells MC may be arranged in the same structure along the third direction. For example, in the memory cell MC arranged between a wordline WL1 and a bitline BL1, the switching material layer SW may be electrically connected to the wordline WL1, the variable resistance layer ME may be electrically connected to the bitline BL1, and the variable resistance layer ME and the switching material layer SW may be connected in series. However, inventive concepts are not limited thereto. For example, unlike the illustration in FIG. 6, the positions of the switching material layer SW and the variable resistance layer ME in the memory cell MC may be switched. For example, in the memory cell MC, the variable resistance layer ME may be connected to the wordline WL1, and the switching material layer SW may be connected to the bitline BL1.

A method of driving the memory device 100 will be briefly described as below. In the memory device 100, a voltage may be applied to the memory cells MC through the wordlines WL1 and WL2 and the bitlines BL1, BL2, BL3, and BL4, so that a current flows in the variable resistance layers ME. The variable resistance layers ME may be changed into one of a plurality of resistance states by an applied electric pulse. The variable resistance layers ME may include a phase change material of which a crystal state changes according to the amount of current. The phase change material may change into an amorphous state with a relatively high resistance or a crystal state with a relatively low resistance. The phase change material may undergo a phase change due to the Joule's heat generated according to the amount of current, and data may be written using the phase change. The phase change material may include a chalcogenide-based material. If necessary, the variable resistance layers ME may have a multilayer structure in which two or more layers having different physical properties are stacked or a super-lattice structure in which a plurality of layers including different materials are alternately stacked.

In addition, any memory cell MC may be addressed by selecting the wordline WL1 or WL2 and the bitline BL1, BL2, BL3, or BL4, and the memory cell MC may be programmed by applying a desired and/or alternatively predetermined signal between the selected wordline and the bitline. In addition, by measuring a current value through the bitlines BL1, BL2, BL3, and BL4, information according to a resistance value of the variable resistance layer ME of the corresponding memory cell MC, e.g., programmed information, may be read out.

In some embodiments, each memory cell MC may have a structure like one of the memory devices 20 described with reference to FIGS. 4 and 5, where the first electrode layer 11 and second electrode layer 14 respectively may be portions of a corresponding word line (e.g., WL1) and a corresponding bit line (e.g., BL1). Alternatively, the first electrode layer 11 and second electrode layer 14 respectively may be portions of a corresponding word line (e.g., WL1) and a corresponding bit line (e.g., BL1). Alternatively, in some embodiments, each memory cell MC may have a structure like the memory cells MC1, MC3, and/or MC4 in the memory devices 200, 300, 400, and 500 described below with reference to FIGS. 7-8, 9, and 10.

Figure 7:
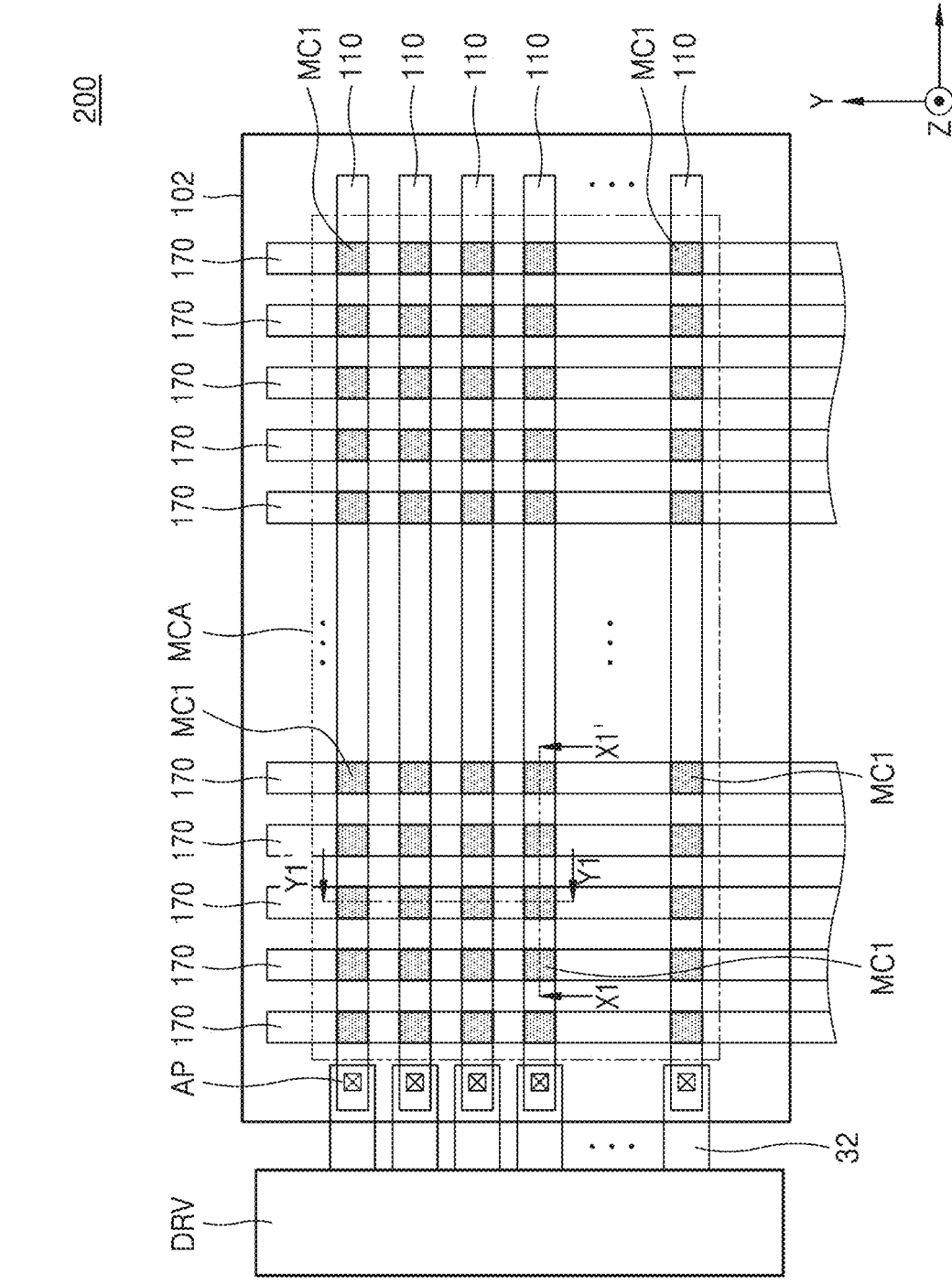
FIG. 7 is a schematic planar layout diagram showing a partial configuration of a memory device according to another embodiment.
Figure 8:
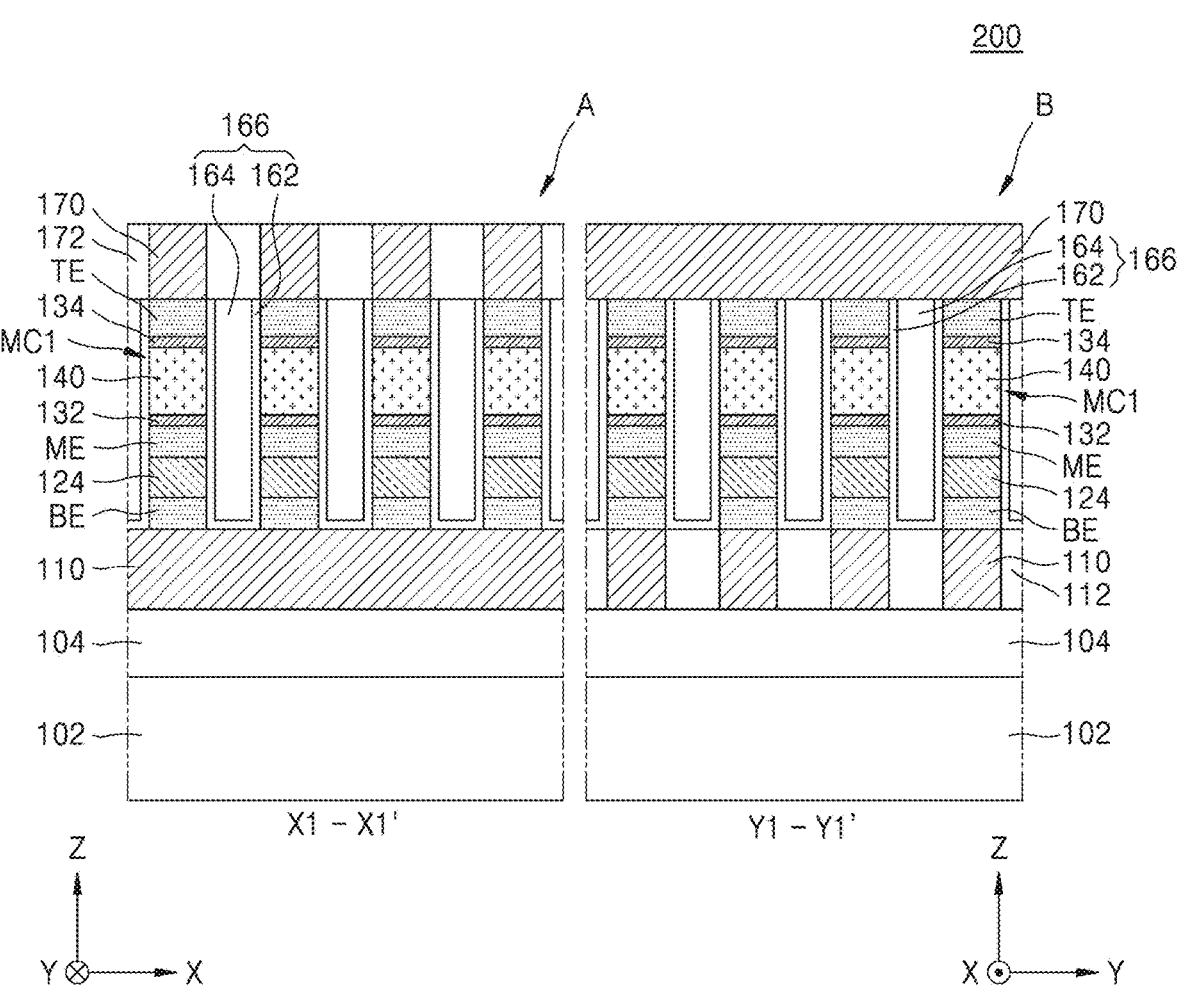
FIG. 8 shows cross-sectional views (A) and (B) taken along line X1-X1' and line Y1-Y1' of FIG. 7, respectively.

FIG. 7 is a schematic planar layout diagram showing a partial configuration of a memory device 200 according to another embodiment. In FIG. 8, (A) is a cross-sectional view taken alone line X1-X1' of FIG. 7, and (B) is a cross-sectional view taken alone line Y1-Y1' of FIG. 7.

As illustrated in FIGS. 7 and (A) of FIG. 8, the memory device 200 according to an embodiment may include a first electrode line layer arranged on a substrate 102 and including a plurality of first electrode lines 110 which extend in a first direction (X direction) and are spaced apart from each other; and a second electrode line layer arranged on the first electrode line layer and including a plurality of second electrode lines 170 which extend in a second direction (Y direction) different from the first direction (X-direction) and are spaced apart from each other. In the present embodiment, a case where the first direction (X direction) and the second direction (Y direction) are orthogonal to each other is described, but inventive concepts are not limited thereto. In an embodiment, the plurality of first electrode lines 110 may be composed of the wordlines WL1 and WL2 as shown in FIG. 6, and the plurality of second electrode lines 170 may be composed of bitlines BL1, BL2, BL3, and BL4 as shown in FIG. 6. In another embodiment, the plurality of electrode lines 110 may be composed of the bitlines BL1, BL2, BL3, and BL4, and the plurality of second electrode lines 170 may be composed of the wordlines WL1 and WL2. The wordlines WL1 and WL2 may intersect the bitlines BL1, BL2, BL3, and BL4 to form crossing points, and at the crossing points, a plurality of memory cells MC1 electrically connected between the wordlines WL1 and WL2 and the bitlines BL1, BL2, BL3, and BL4 may be arranged.

The plurality of memory cells MC1 may have a pillar structure in a rectangular pillar form as illustrated. However, embodiments are not limited thereto, and the memory cells may also have various pillar forms such as a cylindrical pillar, an elliptical pillar a polygonal pillar. In addition, the memory cells may have a structure with the lower portion wider than the upper portion or a structure with the upper portion wider than the lower portion, according to a method of forming the plurality of memory cells. For example, in the case where the plurality of memory cells are formed by an engraving etching process, the memory cells may have a structure with the lower portion wider than the upper portion. In addition, in the case where the plurality of memory cells are formed by a damascene process, the memory cells may have a structure with the upper portion wider than the lower portion. However, the difference in width between the upper portion and the lower portion may be made to be almost zero by etching material layers such that the side is almost vertical, through precisely controlling the etching in the engraving etching process or damascene process.

An interlayer insulating film 104 may be disposed on a substrate 102. The interlayer insulating film 104 may be an oxide film, a nitride film, or a combination thereof. The interlayer insulating film 104 may electrically isolate the plurality of first electrode lines 110 from the substrate 102. Although (A) of FIG. 8 illustrates a configuration with the interlayer insulating film 104 disposed on the substrate 102, inventive concepts are not limited thereto. For example, an integrated circuit layer may be disposed on the substrate, and the plurality of memory cells MC1 may be disposed on the integrated circuit layer. The integrated circuit layer may include a peripheral circuit for operating the plurality of memory cells and/or a core circuit for arithmetic operations or the like.

The plurality of first electrode lines 110 may be connected to drivers DRV. The drivers DRV may be circuits for applying a voltage to the plurality of first electrode lines 110. The drivers DRV may apply a voltage to respective access points of the plurality of first electrode lines 110 though interconnects. When a set write is performed, a selected memory cell MC1 may receive a voltage applied through a selected first electrode line 110 and a selected second electrode line 170. For example, as a set high voltage is applied to the selected first electrode line 110 through an access point AP and a set low voltage that is lower than the set high voltage is applied to the selected second electrode line 170 through an access point AP, a voltage which corresponds to a difference in potential between the set high voltage and the set low voltage is applied to both ends of the selected memory cell MC1, a set current flows through the selected memory cell MC1, and accordingly, current may flow through the plurality of first electrode lines 110 and the plurality of second electrode lines 170.

A plurality of first insulation lines 112 are interposed between the plurality of first electrode lines 110, and a plurality of second insulation lines 172 are interposed between the plurality of second electrode lines 170. The plurality of first insulation lines 112 and the plurality of second insulation lines 172 may be silicon oxide films, silicon nitride films, or a combination thereof.

The plurality of first electrode lines 110 and the plurality of second electrode lines 170 may be formed of the same conductive materials as those of the first electrode layer 11, the second electrode layer 14, or the third electrode layer 15. The plurality of first electrode lines 110 and the plurality of second electrode lines 170 may each further include a conductive barrier film. The conductive barrier film may include, for example, Ti, TiN, Ta, TaN, or a combination thereof. In embodiments, the plurality of first electrode lines 110 may be a metal film, and the plurality of second electrode lines 170 may be a multilayer including a conductive metal nitride film and a metal film.

The plurality of memory cells MC1 arranged at the plurality of crossing points between the plurality of first electrode lines 110 and the plurality of second electrode line 170 may be insulated from each other by insulation structures 166. The insulation structures 166 may cover the sidewalls of the plurality of memory cells MC1, on the plurality of first insulation lines 112. The insulation structures 166 may include an encapsulation liner 162 which contacts the sidewall of each of the plurality of memory cells MC1, and a gap fill insulation film 164 which is spaced apart from each of the plurality of memory cells MC1 with the encapsulation liner 162 therebetween and fills, on the encapsulation liner 162, the space between the memory cells MC1.

In one embodiment, the plurality of first insulation lines 112, the plurality of second insulation lines 172, the encapsulation liners 162, and the gap fill insulation films 164 may each be silicon oxide films, silicon nitride films, or combinations thereof. In other embodiments, the gap fill insulation films 164 may include a seam or an air gap. As used herein, the term "air" may mean any gas present in atmosphere or during a manufacturing process. For example, the first insulation lines 112 may be silicon nitride films, the encapsulation liners 162 may be silicon oxide films, silicon nitride films, or a combination thereof, and the gap fill insulation films 164 may be silicon oxide films.

The plurality of memory cells MC1 may each include a lower electrode BE, a switching material layer 124, a middle electrode ME, a lower barrier 132, a variable resistance layer 140, an upper barrier 134, and an upper electrode TE that are sequentially stacked on a first electrode line 110.

In the plurality of memory cells MC1, the lower electrode BE, the middle electrode ME, the upper electrode TE may respectively include, for example: W, Ti, Ta, Al, Cu, C, CN, TiN, TiAlN, TiSiN, TiCN, TiCSiN, WN, CoSiN, WSiN, TaN, TaCN, TaSiN, or a combination thereof, but embodiments are not limited thereto.

In the plurality of memory cells MC1, the switching material layer 124 may be configured to be electrically connected to the variable resistance layer 140. The switching material layer 124 may include a chalcogenide-based switching material and the chalcogenide-based switching material may include: a chalcogenide material including Ge, Sb, and Se; and a dopant, and the dopant may include at least one metal or metalloid element selected from In, Al, Sr, and Si, an oxide of the metal or metalloid element, or a nitride of the metal or metalloid element. For example, the switching material layer 124 may include a chalcogenide-based switching material including any of the compounds represented by Formulae 1 to 3. For example, the switching material layer 124 may include a chalcogenide-based switching material having the composition according to the embodiments described above.

As illustrated in (A) of FIG. 8, the lower surface of the variable resistance layer 140 may contact the lower barrier 132, and the upper surface of the variable resistance layer 140 may contact the upper barrier 134. The lower barrier 132 and the upper barrier 134 may each include a conductive material, for example, W, WN, WC, or a combination thereof, but embodiments are not limited thereto.

In the memory device 200, the switching material layer 124 may be connected to a first electrode line 110, which is one of the plurality of first electrode lines 110, by means of the lower electrode BE, and the variable resistance layer 140 may be connected to a second electrode line 170, which is one of the plurality of second electrode lines 170, by means of the upper barrier 134 and the upper electrode TE.

In (A) of FIG. 8, the sidewalls of the lower electrode BE, the switching material layer 124, the middle electrode ME, the lower barrier 132, the variable resistance layer 140, the upper barrier 134, and the upper electrode TE are illustrated as extending in the vertical direction (Z direction), but inventive concepts are not limited thereto. For example, the sidewalls of the lower electrode BE, the switching material layer 124, the middle electrode ME, the lower barrier 132, the variable resistance layer 140, the upper barrier 134, and the upper electrode TE may be tapered sidewalls.

In the memory device 200 having such a configuration, the switching material layer 124 may include a chalcogenide-based switching material as described above, and thus, structural stability may be enhanced even with aging. In each of the plurality of memory cells MC1, a threshold voltage drift may be suppressed. The plurality of memory cells MC1 may have a reduced threshold voltage drift, compared to a memory cell including a chalcogenide switching material consisting of Ge, Sb, and Se.

Figure 9:
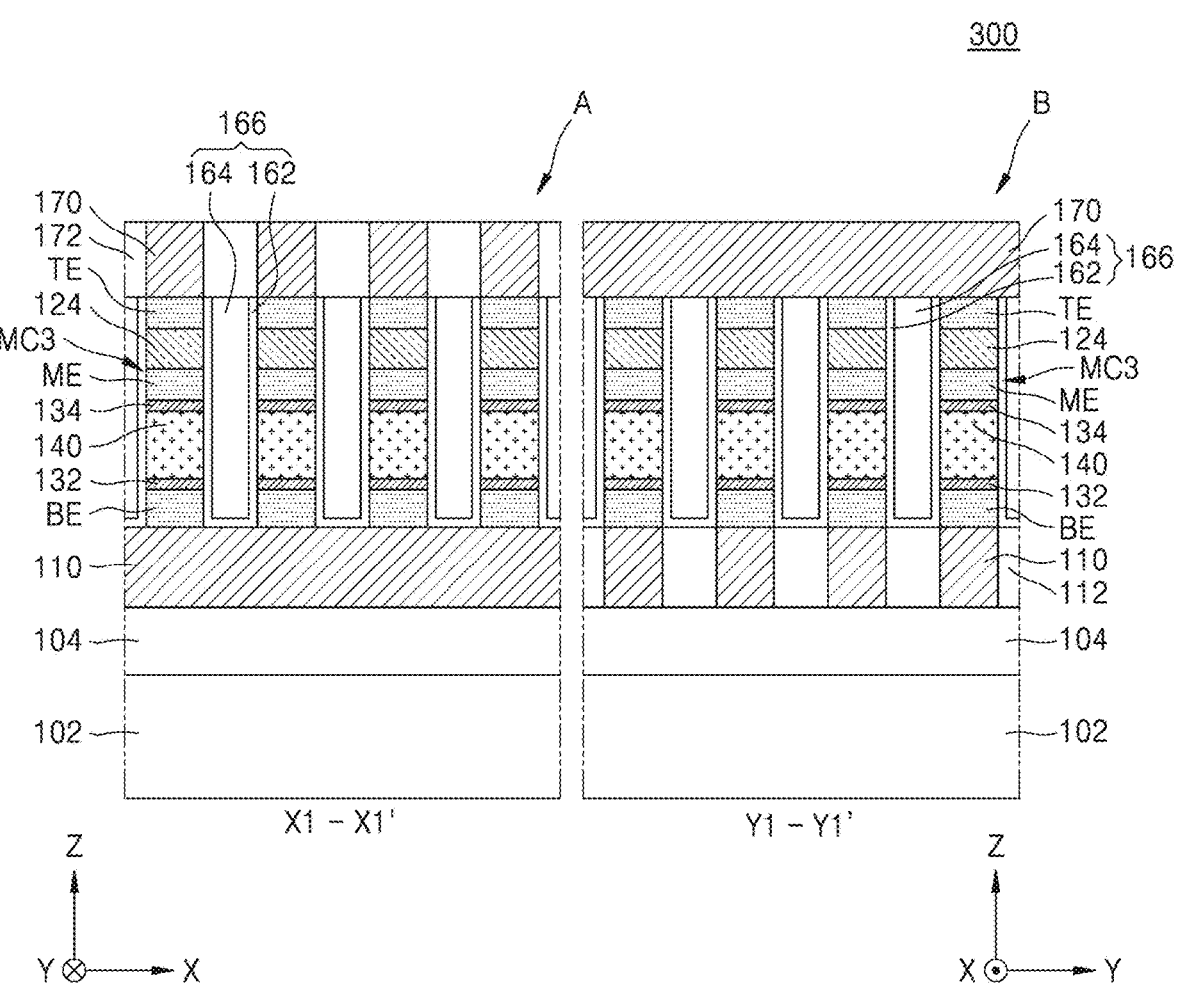
FIG. 9 shows cross-sectional views of a memory device according to another embodiment.

FIG. 9 shows cross-sectional views of a memory device according to another embodiment. In FIG. 9, the same reference numerals as in FIG. 8 indicate the same members, and redundant descriptions thereof are omitted here. In FIG. 9, (A) and (B) show partial configurations of portions corresponding to cross-sections taken along line X1-X1' and line Y1-Y1' of FIG. 7, respectively.

Referring to FIG. 9, a memory device 300 may have mostly the same configuration as that of the memory device 200 described with reference to FIG. 7, and (A) and (B) of FIG. 8. However, the memory device 300 includes a plurality of memory cells MC3, instead of the plurality of memory cells MC1.

The plurality of memory cells MC3 may have almost the same configuration as the plurality of memory cells MC1 described with reference to FIG. 7, and (A) and (B) of FIG. 8. However, the plurality of memory cells MC3 may each include a lower electrode BE, a lower barrier 132, a variable resistance layer 140, an upper barrier 134, a middle electrode ME, a switching material layer 124, and an upper electrode TE, which are sequentially stacked on a first electrode line 110.

In the memory device 300, the variable resistance layer 140 may be connected to a first electrode line 110, which is one of the plurality of first electrode lines 110, by means of the lower barrier 132 and the lower electrode BE, and the switching material layer 124 may be connected to a second electrode line 170, which is one of the plurality of second electrode lines 170, by means of the upper electrode TE.

Figure 10:
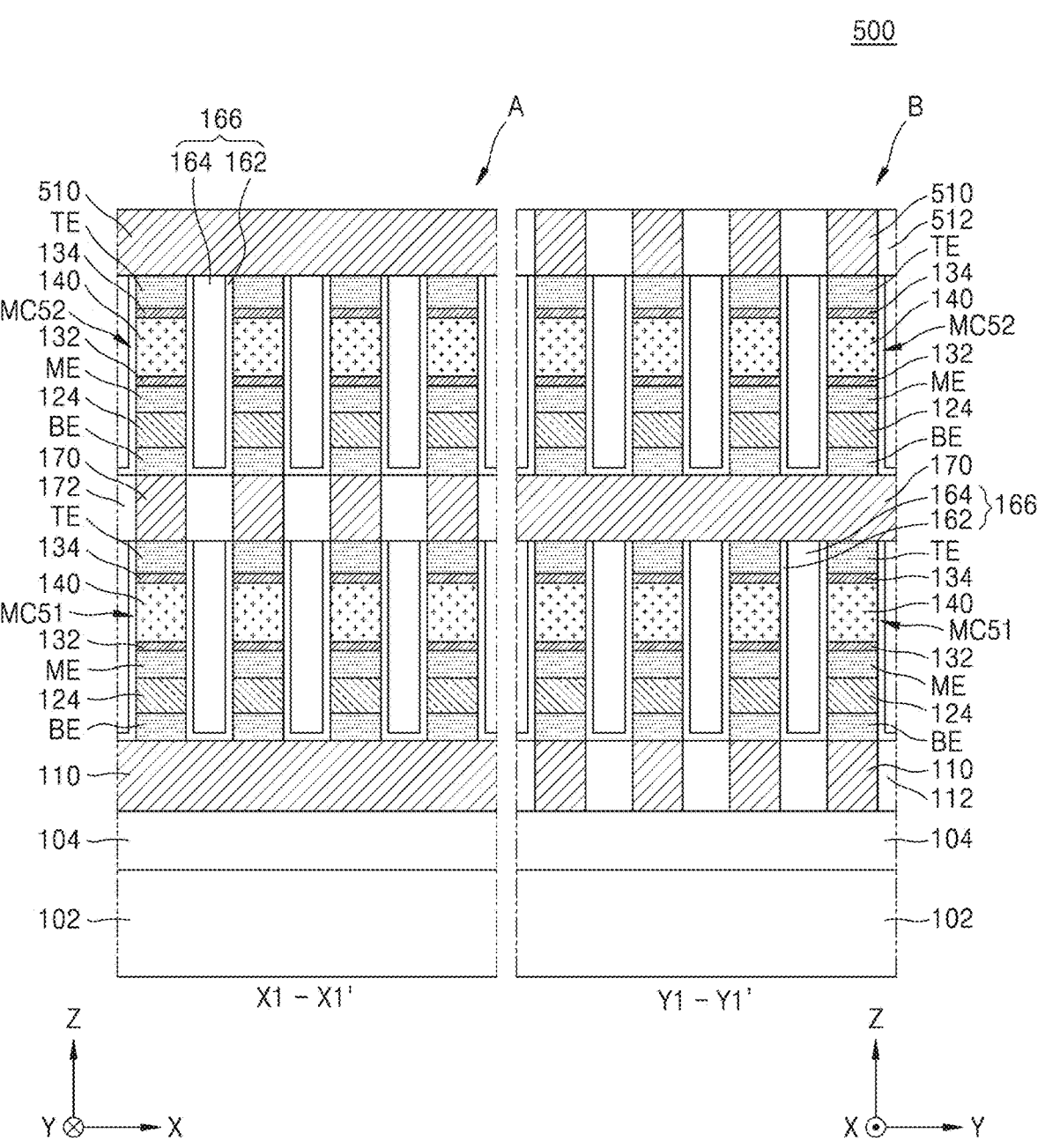
FIG. 10 shows cross-sectional views of a memory device according to another embodiment.

FIG. 10 shows cross-sectional views of a memory device according to another embodiment. In FIG. 10, the same reference numerals as in FIG. 7 and (A) and (B) of FIG. 8 indicate the same members, and redundant descriptions thereof are omitted here. In FIG. 10, (A) and (B) show partial configurations of portions of cross-sections taken along line X1-X1' and line Y1-Y1' of FIG. 7, respectively.

Referring to FIG. 10, a memory device 500 may include: a first electrode line layer including a plurality of first electrode lines 110 which extend in a first direction (X direction) on a substrate 102 and are arranged spaced apart from each other; a second electrode line layer including a plurality of second electrode lines 170 which are arranged on the first electrode line layer, extend in a second direction (Y direction) different from the first direction, and are spaced apart from each other; and a plurality of third electrode lines 510 which are arranged on the second electrode line layer, extend in the first direction (X direction), and are spaced apart from each other. A plurality of third insulation lines 512 may be interposed between the plurality of third electrode lines 510. The plurality of third insulation lines 512 may include silicon oxide films, silicon nitride films, or a combination thereof.

A plurality of first level memory cells MC51 may be arranged respectively at a plurality of crossing points between the plurality of first electrode lines 110 and the plurality of second electrode lines 170, and a plurality of second level memory cells MC52 may be arranged respectively at a plurality of crossing points between the plurality of second electrode lines 170 and the plurality of third electrode lines 510. The plurality of first level memory cells MC51 and the plurality of second level memory cells MC52 may be formed at different levels in a vertical direction (Z direction). The plurality of first level memory cells MC51 and the plurality of second level memory cells MC52 may have mostly the same configuration as that of the plurality of memory cells MC1 described with reference to FIG. 8. The upper electrode TE of each of the plurality of second level memory cells MC52 may be connected to one third electrode line 510 selected from the plurality of third electrode lines 510.

The plurality of first electrode lines 110, the plurality of second electrode lines 170, and the plurality of third electrode lines 510 may each include a plurality of wordlines or a plurality of bitlines. In an embodiment, the plurality of first electrode lines 110 and the plurality of third electrode lines 510 may each constitute a plurality of bitlines, and the plurality of second electrode lines 170 may constitute a common wordline. In other embodiments, the plurality of first electrode lines 110 and the plurality of third electrode lines 510 may each constitute a plurality of wordlines, and the plurality of second electrode lines 170 may constitute a common bitline. The constituent material of the plurality of third electrode lines 510 may be mostly the same as described above with respect to the plurality of first electrode lines 110 and the plurality of second electrode lines 170 illustrated in FIG. 8.

The memory device 500 may have a two-layer stack structure including the plurality of first level memory cells MC51 and the plurality of second level memory cells MC52, which are formed at two different levels in the vertical direction (Z direction). Although FIG. 10 illustrates the embodiment in which the plurality of first level memory cells MC51 and the plurality of second level memory cells MC52 have mostly the same configuration as that of the plurality of memory cells MC1 described with reference to FIG. 8, inventive concepts are not limited thereto. In the memory device 500 illustrated in FIG. 10, the plurality of first level memory cells MC51 and the plurality of second level memory cells MC52 may include a switching material layer 124 including a chalcogenide-based switching material as described above.

According to an article presented at European Phase Change and Ovonic Symposium, "Structural relaxation in chalcogenide-based phase change memories (PCMs): From defect-annihilation kinetic to device-reliability prediction," by S. Lavizzari et al., in the mobility edge theory of ovonic threshold switching materials, structural relaxation is a factor that a bandgap edge is shifted and thus increases bandgap energy and causes a threshold voltage drift.

Cohesive energy refers to the energy required for a structure formed by the first principle (Ab initio) calculation method to stabilize with time. It was determined that a structure with low cohesive energy had considerable structural relaxation, and thus threshold voltage drift using cohesive energy and bandgap energy was evaluated.

Example 1

A switching element was obtained with each element having a cross-point structure composed of metal (lower electrode, Pt 50 nm)/switching material layer (30 nm)/metal (upper electrode, TiN 50 nm) using photolithography and lift-off techniques. Here, as switching material layers, chalcogenide-based material ($Ge_{20}Sb_{20}Se_{60}In_5$) thin films were used. The $Ge_{20}Sb_{20}Se_{60}In_5$ thin films were each formed by co-sputtering deposition using Ge, Sb, Se, and In targets. The compositions of the thin films were adjusted by changing radio-frequency (RF) power imposed on each target. The composition contents of Ge, Sb, Se, and In were determined to be 20 at %, 20 at %, 60 at %, and 5 at %, respectively, by Electron Prob Micro Analysis (EPMA) and X-ray Fluorescence (XRF) analysis. The size of a cross-point structure element was defined with the overlapping area of the upper and lower electrode metals. According to FIG. 6, a memory device including the switching element was obtained.

Example 2

A memory device was obtained in the same manner as in Example 1, except that a chalcogenide-based material ($Ge_{20}Sb_{20}Se_{60}In_{10}$) thin films were used as switching material layers and that the composition contents of Ge, Sb, Se, and In were determined to be 20 at %, 20 at %, 60 at %, and 10 at %, respectively, by EPMA and XRF analysis.

Comparative Example 1

A memory device was obtained in the same manner as in Example 1, except that a chalcogenide-based material ($Ge_{20}Sb_{20}Se_{60}$) thin films were used as switching material layers and that the composition contents of Ge, Sb, and Se were determined to be 20 at %, 20 at %, 60 at %, respectively, by EPMA and XRF analysis.

Evaluation Examples

Table 1 shows the results of evaluation of threshold voltage drift (Vth_drift) for memory devices including switching material layers having compositions according to Examples 1 and 2 and Comparative Example 1. Threshold voltage drifts and threshold voltage drift reduction rates of the memory devices were evaluated by the following method.

The cohesive energy ($E_{coh}$) and the bandgap energy ($E_g$) of each bonding structure of the chalcogenide-based materials in the switching material layers were calculated. Given that $E_{coh}/E_g$ is proportional to threshold voltage drift, a threshold voltage drift (Vth_drift, mV/dec) was calculated. The calculated threshold voltage drift was substituted into Equation 1 to calculate a threshold voltage drift reduction rate (%).

Threshold voltage drift reduction rate (%)=[{
($V$th_drift of Comparative Example 1)−
($V$th_drift of Example 1 (or 2))/($V$th_drift of
Comparative Example 1)}×100]     [Equation 1]

TABLE 1

| | Vth_drift (mV/dec) | Vth_drift reduction rate (%) |
|---|---|---|
| Comparative Example 1 | 49.5 | — |
| Example 1 | 36.3 | 26 |
| Example 2 | 9.1 | 81 |

Referring to Table 1, the threshold drifts of the memory devices including the chalcogenide-based materials of Example 1 ($Ge_{20}Sb_{20}Se_{60}In_5$) and Example 2 ($Ge_{20}Sb_{20}Se_{60}In_{10}$) as (?in) the switching material layers were lower compared to the memory device including the chalcogenide-based material of Comparative Example 1 ($Ge_{20}Sb_{20}Se_{60}$). The memory devices including the chalcogenide-based materials of Example 1 ($Ge_{20}Sb_{20}Se_{60}In_5$) and Example 2 ($Ge_{20}Sb_{20}Se_{60}In_{10}$) had a threshold voltage drift reduction rate of 25% and 81%, respectively, compared to that of the memory device including the chalcogenide-based material of Comparative Example 1 ($Ge_{20}Sb_{20}Se_{60}$).

As described above, the chalcogenide-based material according to the one or more embodiments may include: a chalcogenide material including Ge, Sb, and Se; and a dopant, wherein the dopant includes at least one metal or metalloid element selected from In, Al, Sr, and Si, an oxide of the metal or metalloid element, or a nitride of the metal or metalloid element. A switching element and a memory device which use the chalcogenide-based material in a switching material layer may have enhanced structural stability and suppressed threshold voltage drift.

From this, it can be confirmed that the memory devices according to the embodiments of inventive concepts in the present disclosure may have enhanced structural stability and limited and/or suppressed threshold voltage drift.

Memory devices according to example embodiments may be applied to an electronic device. For example, FIG. 11 is a diagram of an electronic device including a memory device according to example embodiments.

Figure 11:
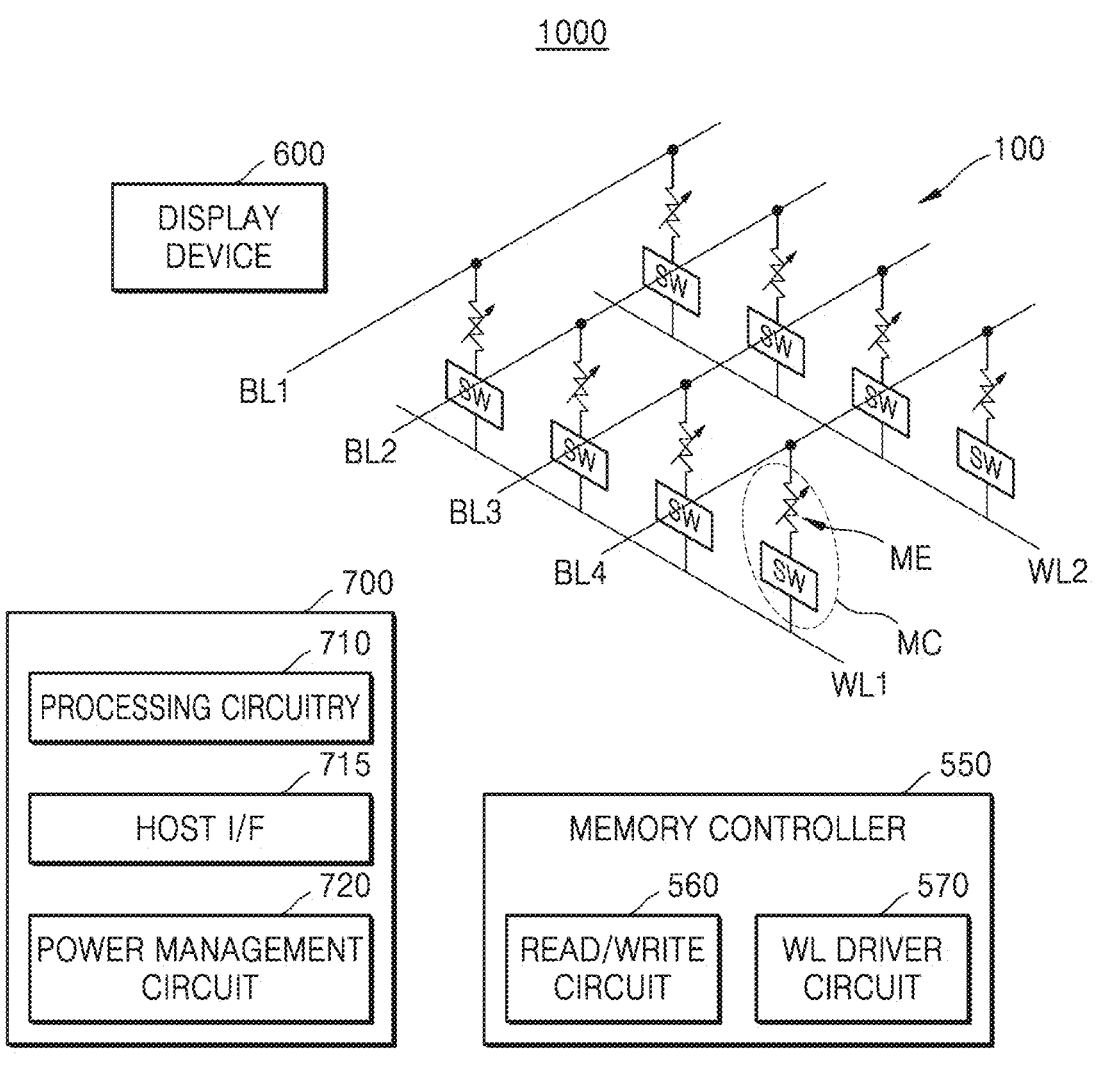
FIG. 11 is a diagram of an electronic device including a memory device according to example embodiments.

Referring to FIG. 11, an electronic device 1000 may include a controller 700, a memory controller 550, a display device 600 (e.g., OLED display, holographic display), and a memory device 100. The memory controller 550 may include a read/write circuit 560 and a word line driver circuit 570. The read/write circuit 560 and word line driver circuit 570 may be electrically connected to the memory device 100 through first electrode lines (e.g., WL1) and second electrode lines (e.g., BL1). The controller 700 may control operations of the electronic device 1000 and may include processing circuitry 710, a host interface 715, and a power management circuit 720. The memory device 100 may be implemented using any one of the memory devices 20, 100, 200, 300, and 500 described above with reference to FIGS. 4-10.

When the controller 700 receives commands from an external host (not shown) through the host interface 715, the processing circuitry 710 may operate in response to those commands and may control operations of the display device 600, memory controller 550, and/or memory device 100. The controller 700 may control the display device 600 by providing commands and information to the display device 600 and by controlling power to the display device 600 using the power management circuit 720. The controller 700 may control power provided to the memory controller 550 and memory device 100 using the power management circuit 720.

The controller 700 may control operations of the memory device 100 by providing commands to the memory controller 550. The controller 700 may also provide the memory controller 550 with data to be written in the memory device 100 and/or may receive data read from the memory device 100. The memory controller 550, in response to receiving commands from the controller 700 and/or in response to receiving data for a write operation, may control the memory device 100 using the read/write circuit 560 and word line driver circuit 570 to write data, read data, and/or erase data in one or more selected semiconductor unit devices MC of the memory device 100. The memory controller 550, in response to receiving commands from the controller 700, may read data from the memory device 100 and provide the data read from the memory device 100 to the controller 700.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of inventive concepts as defined by the following claims.

What is claimed is:

1. A chalcogenide-based material comprising:
a chalcogenide material including Ge, Sb, and Se; and
a dopant,
wherein the dopant includes a metal or metalloid element selected from In, Al, Sr, and Si, an oxide of the metal or metalloid element, or a nitride of the metal or metalloid element,
wherein, in the chalcogenide-based material, an amount of Ge is greater than or equal to 10 at % and less than or equal to 40 at %, an amount of Sb is greater than or equal to 20 at % and less than or equal to 50 at %, an amount of Se is greater than or equal to 30 at % and less than or equal 80 at %, and an amount of the dopant is greater than 0% and less than the amount of Se, and
wherein at % refers to atomic percentage.

2. The chalcogenide-based material of claim 1,
wherein the chalcogenide-based material does not include As.

3. The chalcogenide-based material of claim 1,
wherein the chalcogenide-based material comprises a compound represented by Formula 1:

$$Ge_a Sb_b Se_c M_d \qquad \text{[Formula 1]}$$

wherein, in Formula 1,
M is at least one metal or metalloid element selected from In, Al, Sr, and Si,
10 at % $\leq$ a $\leq$ 40 at %, 20 at % $\leq$ b $\leq$ 50 at %, 30 at % $\leq$ c $\leq$ 80 at %, 0.5 at % $\leq$ d $\leq$ 10 at %,
a+b+c+d=100 at %.

4. The chalcogenide-based material of claim 3,
wherein, in Formula 1, 10 at % $\leq$ a $\leq$ 25 at %, 20 at % $\leq$ b $\leq$ 25 at %, and 55 at % $\leq$ c $\leq$ 80 at %.

5. The chalcogenide-based material of claim 1,
wherein the chalcogenide-based material comprises a compound represented by Formula 2:

$$Ge_{a1} Sb_{b1} Se_{c1} (M1_x O_y)_{d1} \qquad \text{[Formula 2]}$$

wherein, in Formula 2,
M1 is at least one metal or metalloid element selected from In, Al, Sr, and Si,
10 at % $\leq$ a1 $\leq$ 40 at %, 20 at % $\leq$ b1 $\leq$ 50 at %, 30 at % $\leq$ c1 $\leq$ 80 at %, 0.5 at % $\leq$ d1 $\leq$ 10 at %,
30 at % $\leq$ x $\leq$ 70 at %, 30 at % $\leq$ y $\leq$ 70 at %,
a1+b1+c1+d1=100 at %, and x+y=100 at %.

6. The chalcogenide-based material of claim 1,
wherein the chalcogenide-based material comprises a compound represented by Formula 3:

$$Ge_{a2} Sb_{b2} Se_{c2} (M2_{x1} N_{y1})_{d2} \qquad \text{[Formula 3]}$$

wherein, in Formula 3,
M2 is at least one metal or metalloid element selected from In, Al, Sr, and Si,
10 at % $\leq$ a2 $\leq$ 40 at %, 20 at % $\leq$ b2 $\leq$ 50 at %, 30 at % $\leq$ c2 $\leq$ 80 at %, 0.5 at % $\leq$ d2 $\leq$ 10 at %,
30 at % $\leq$ x1 $\leq$ 70 at %, 30 at % $\leq$ y1 $\leq$ 70 at %,
a2+b2+c2+d2=100 at %, and x1+y1=100 at %.

7. The chalcogenide-based material of claim 1,
wherein the chalcogenide-based material comprises at least one selected from $Ge_{20}Sb_{20}Se_{60}In_5$, $Ge_{20}Sb_{20}Se_{60}In_{10}$, $Ge_{20}Sb_{20}Se_{60}Al_5$, $Ge_{20}Sb_{20}Se_{60}Al_{10}$, $Ge_{20}Sb_{20}Se_{60}Sr_5$, $Ge_{20}Sb_{20}Se_{60}Sr_{10}$, $Ge_{20}Sb_{20}Se_{60}Si_5$, $Ge_{20}Sb_{20}Se_{60}Si_{10}$, $Ge_{20}Sb_{20}Se_{60}(In_{x3}Al_{y3})_5$, $Ge_{20}Sb_{20}Se_{60}(In_{x3}Al_{y3})_{10}$, $Ge_{20}Sb_{20}Se_{60}(In_{x3}Sr_{y3})_5$, $Ge_{20}Sb_{20}Se_{60}(In_{x3}Sr_{y3})_{10}$, $Ge_{20}Sb_{20}Se_{60}(In_{x3}Si_{y3})_5$, $Ge_{20}Sb_{20}Se_{60}(In_{x3}Si_{y3})_{10}$, $Ge_{20}Sb_{20}Se_{60}(Al_{x3}Sr_{y3})_5$, $Ge_{20}Sb_{20}Se_{60}(Al_{x3}Sr_{y3})_{10}$, $Ge_{20}Sb_{20}Se_{60}(Al_{x3}Si_{y3})_5$, $Ge_{20}Sb_{20}Se_{60}(Al_{x3}Si_{y3})_{10}$, $Ge_{20}Sb_{20}Se_{60}(Sr_{x3}Si_{y3})_5$, $Ge_{20}Sb_{20}Se_{60}(Sr_{x3}Si_{y3})_{10}$, $Ge_{20}Sb_{20}Se_{60}(In_{x2}O_{y2})_5$, $Ge_{20}Sb_{20}Se_{60}(In_{x2}O_{y2})_{10}$, $Ge_{20}Sb_{20}Se_{60}(Al_{x2}O_{y2})_5$, $Ge_{20}Sb_{20}Se_{60}(Al_{x2}O_{y2})_{10}$, $Ge_{20}Sb_{20}Se_{60}(Sr_{x2}O_{y2})_5$, $Ge_{20}Sb_{20}Se_{60}(Sr_{x2}O_{y2})_{10}$, $Ge_{20}Sb_{20}Se_{60}(Si_{x2}O_{y2})_5$, $Ge_{20}Sb_{20}Se_{60}(Si_{x2}O_{y2})_{10}$, $Ge_{20}Sb_{20}Se_{60}(In_{x2}N_{y2})_5$, $Ge_{20}Sb_{20}Se_{60}(In_{x2}N_{y2})_{10}$, $Ge_{20}Sb_{20}Se_{60}(Al_{x2}N_{y2})_5$, $Ge_{20}Sb_{20}Se_{60}(Al_{x2}N_{y2})_{10}$, $Ge_{20}Sb_{20}Se_{60}(Sr_2N_{y2})_5$, $Ge_{20}Sb_{20}Se_{60}(Sr_2N_{y2})_{10}$, $Ge_{20}Sb_{20}Se_{60}(Si_{x2}N_{y2})_5$, and $Ge_{20}Sb_{20}Se_{60}(Si_{x2}N_{y2})_{10}$,
wherein 30 at % $\leq$ x2 $\leq$ 70 at %, 30 at % $\leq$ y2 $\leq$ 70 at %, and x2+y2=100 at %, and
wherein 0 at % $<$ x3 $<$ 100 at %, 0 at % $<$ y3 $<$ 100 at %, and x3+y3=100 at %.

8. A switching element comprising:
a first electrode layer;
a second electrode layer facing the first electrode layer; and
a switching material layer between the first electrode layer and the second electrode layer, wherein
the switching material layer includes a chalcogenide-based switching material,
the chalcogenide-based switching material includes a chalcogenide material including Ge, Sb, and Se, and a dopant, and
the dopant includes a metal or metalloid element selected from In, Al, Sr, and Si, an oxide of the metal or metalloid element, or a nitride of the metal or metalloid element, wherein in the chalcogenide-based switching material, an amount of Ge is greater than or equal to 10 at % and less than or equal to 40 at %, an amount of Sb is greater than or equal to 20 at % and less than or equal to 50 at %, an amount of Se is greater than or equal to 30 at % and less than or equal 80 at %, and an amount of the dopant is greater than 0% and less than the amount of Se, and wherein at % refers to atomic percentage.

9. The switching element of claim 8, wherein the chalcogenide-based switching material exhibits an ovonic threshold switching material properties.

10. The switching element of claim 8, wherein the chalcogenide-based switching material comprises a compound represented by Formula 1:

$$Ge_aSb_bSe_cM_d \qquad \text{[Formula 1]}$$

wherein, in Formula 1,
M is at least one metal or metalloid element selected from In, Al, Sr, and Si,
10 at %≤a≤40 at %, 20 at %≤b≤50 at %, 30 at %≤c≤80 at %, 0.5 at %≤d≤10 at %, and
a+b+c+d=100 at %.

11. The switching element of claim 8, wherein the chalcogenide-based switching material comprises a compound represented by Formula 2:

$$Ge_{a1}Sb_{b1}Se_{c1}(M1_xO_y)_{d1} \qquad \text{[Formula 2]}$$

wherein, in Formula 2,
M1 is at least one metal or metalloid element selected from In, Al, Sr, and Si,
10 at %≤a1≤40 at %, 20 at %≤b1≤50 at %, 30 at %≤c1≤80 at %, 0.5 at %≤d1≤10 at %,
30 at %≤x≤70 at %, 30 at %≤y≤70 at %,
a1+b1+c1+d1=100 at %, and x+y=100 at %.

12. The switching element of claim 8, wherein the chalcogenide-based switching material comprises a compound represented by Formula 3:

$$Ge_{a2}Sb_{b2}Se_{c2}(M2_{x1}N_{y1})_{d2} \qquad \text{[Formula 3]}$$

wherein, in Formula 3,
M2 is at least one metal or metalloid element selected from In, Al, Sr, and Si,
10 at %≤a2≤40 at %, 20 at %≤b2≤50 at %, 30 at %≤c2≤80 at %, 0.5 at %≤d2≤10 at %,
30 at %≤x1≤70 at %, 30 at %≤y1≤70 at %,
a2+b2+c2+d2=100 at %, and x1+y1=100 at %.

13. The switching element of claim 8, wherein the chalcogenide-based switching material comprises at least one selected from $Ge_{20}Sb_{20}Se_{60}In_5$, $Ge_{20}Sb_{20}Se_{60}In_{10}$, $Ge_{20}Sb_{20}Se_{60}Al_5$, $Ge_{20}Sb_{20}Se_{60}Al_{10}$, $Ge_{20}Sb_{20}Se_{60}Sr_5$, $Ge_{20}Sb_{20}Se_{60}Sr_{10}$, $Ge_{20}Sb_{20}Se_{60}Si_5$, $Ge_{20}Sb_{20}Se_{60}Si_{10}$, $Ge_{20}Sb_{20}Se_{60}(In_{x3}Al_{y3})_5$, $Ge_{20}Sb_{20}Se_{60}(In_{x3}Al_{y3})_{10}$, $Ge_{20}Sb_{20}Se_{60}(In_{x3}Sr_{y3})_5$, $Ge_{20}Sb_{20}Se_{60}(In_{x3}Sr_{y3})_{10}$, $Ge_{20}Sb_{20}Se_{60}(In_{x3}Si_{y3})_5$, $Ge_{20}Sb_{20}Se_{60}(In_{x3}Si_{y3})_{10}$, $Ge_{20}Sb_{20}Se_{60}(Al_{x3}Sr_{y3})_5$, $Ge_{20}Sb_{20}Se_{60}(Al_{x3}Sr_{y3})_{10}$, $Ge_{20}Sb_{20}Se_{60}(Al_{x3}Si_{y3})_5$, $Ge_{20}Sb_{20}Se_{60}(Al_{x3}Si_{y3})_{10}$, $Ge_{20}Sb_{20}Se_{60}(Sr_{x3}Si_{y3})_5$, $Ge_{20}Sb_{20}Se_{60}(Sr_{x3}Si_{y3})_{10}$, $Ge_{20}Sb_{20}Se_{60}(In_{x2}O_{y2})_5$, $Ge_{20}Sb_{20}Se_{60}(In_{x2}O_{y2})_{10}$, $Ge_{20}Sb_{20}Se_{60}(Al_{x2}O_{y2})_5$, $Ge_{20}Sb_{20}Se_{60}(Al_{x2}O_{y2})_{10}$, $Ge_{20}Sb_{20}Se_{60}(Sr_{x2}O_{y2})_5$, $Ge_{20}Sb_{20}Se_{60}(Sr_{x2}O_{y2})_{10}$, $Ge_{20}Sb_{20}Se_{60}(Si_{x2}O_{y2})_5$, $Ge_{20}Sb_{20}Se_{60}(Si_{x2}O_{y2})_{10}$, $Ge_{20}Sb_{20}Se_{60}(In_{x2}N_{y2})_5$, $Ge_{20}Sb_{20}Se_{60}(In_{x2}N_{y2})_{10}$, $Ge_{20}Sb_{20}Se_{60}(Al_{x2}N_{y2})_5$, $Ge_{20}Sb_{20}Se_{60}(Al_{x2}N_{y2})_{10}$, $Ge_{20}Sb_{20}Se_{60}(Sr_2N_{y2})_5$, $Ge_{20}Sb_{20}Se_{60}(Sr_2N_{y2})_{10}$, $Ge_{20}Sb_{20}Se_{60}(Si_{x2}N_{y2})_5$, and $Ge_{20}Sb_{20}Se_{60}(Si_{x2}N_{y2})_{10}$, wherein 30 at %≤x2≤70 at %, 30 at %≤y2≤70 at %, and x2+y2=100 at %, and
wherein 0 at %<x3<100 at %, 0 at %<y3<100 at %, and x3+y3=100 at %.

14. The switching element of claim 8, wherein the chalcogenide-based switching material is an amorphous material in which at least some Se—Se homopolar bonds are substituted with Se-M bonds, and
wherein M is a metal or metalloid element of In, Al, Sr, or Si.

15. The switching element of claim 8, wherein the switching element has a reduced threshold voltage drift compared to a switching element including a chalcogenide switching material consisting of Ge, Sb, and Se, and
wherein, in the chalcogenide-based switching material, the amount of Sb is greater than or equal to 20 at % and less than or equal to 50 at %.

16. A memory device comprising:
a first electrode layer;
a switching material layer on the first electrode layer;
a variable resistance layer on the switching material layer; and
a second electrode layer on the variable resistance layer, wherein
the switching material layer includes a chalcogenide-based switching material,
the chalcogenide-based switching material includes a chalcogenide material including Ge, Sb, and Se, and a dopant, and
the dopant includes a metal or metalloid element selected from In, Al, Sr, and Si, an oxide of the metal or metalloid element, or a nitride of the metal or metalloid element,
wherein, in the chalcogenide-based switching material, an amount of Ge is greater than or equal to 10 at % and less than or equal to 40 at %, an amount of Sb is greater than or equal to 20 at % and less than or equal to 50 at %, an amount of Se is greater than or equal to 30 at % and less than or equal 80 at %, and an amount of the dopant is greater than 0% and less than the amount of Se, and
wherein at % refers to atomic percentage.

17. The memory device of claim 16, wherein the chalcogenide-based switching material comprises a compound represented by Formula 1:

$$Ge_aSb_bSe_cM_d \qquad \text{[Formula 1]}$$

wherein, in Formula 1,
M is at least one metal or metalloid element selected from In, Al, Sr, and Si,
10 at %≤a≤40 at %, 20 at %≤b≤50 at %, 30 at %≤c≤80 at %, 0.5 at %≤ d≤10 at %, and
a+b+c+d=100 at %.

18. The memory device of claim 16, wherein the chalcogenide-based switching material comprises a compound represented by Formula 2:

$$Ge_{a1}Sb_{b1}Se_{c1}(M1_xO_y)_{d1} \qquad \text{[Formula 2]}$$

wherein, in Formula 2,
M1 is at least one metal or metalloid element selected from In, Al, Sr, and Si,
10 at %≤a1≤40 at %, 20 at %≤b1≤50 at %, 30 at %≤c1≤80 at %, 0.5 at %≤d1≤10 at %, and
30 at %≤x≤70 at %, 30 at %≤y≤70 at %,
a1+b1+c1+d1=100 at %, and x+y=100 at %.

19. The memory device of claim 16, wherein the chalcogenide-based switching material comprises a compound represented by Formula 3:

$$\text{Ge}_{a2}\text{Sb}_{b2}\text{Se}_{c2}(\text{M2}_{x1}\text{N}_{y1})_{d2} \qquad \text{[Formula 3]}$$

wherein, in Formula 3,

M2 is at least one metal or metalloid element selected from In, Al, Sr, and Si, 10 at %≤a2≤40 at %, 20 at %≤b2≤50 at %, 30 at %≤c2≤80 at %, 0.5 at %≤d2≤10 at %, 30 at %≤x1≤70 at %, 30 at %≤y1≤70 at %, a2+b2+c2+d2=100 at %, and x1+y1=100 at %.

20. The memory device of claim 16, wherein the chalcogenide-based switching material comprises at least one selected from $\text{Ge}_{20}\text{Sb}_{20}\text{Se}_{60}\text{In}_5$, $\text{Ge}_{20}\text{Sb}_{20}\text{Se}_{60}\text{In}_{10}$, $\text{Ge}_{20}\text{Sb}_{20}\text{Se}_{60}\text{Al}_5$, $\text{Ge}_{20}\text{Sb}_{20}\text{Se}_{60}\text{Al}_{10}$, $\text{Ge}_{20}\text{Sb}_{20}\text{Se}_{60}\text{Sr}_5$, $\text{Ge}_{20}\text{Sb}_{20}\text{Se}_{60}\text{Sr}_{10}$, $\text{Ge}_{20}\text{Sb}_{20}\text{Se}_{60}\text{Si}_5$, $\text{Ge}_{20}\text{Sb}_{20}\text{Se}_{60}\text{Si}_{10}$, $\text{Ge}_{20}\text{Sb}_{20}\text{Se}_{60}(\text{In}_{x3}\text{Al}_{y3})_5$, $\text{Ge}_{20}\text{Sb}_{20}\text{Se}_{60}(\text{In}_{x3}\text{Al}_{y3})_{10}$, $\text{Ge}_{20}\text{Sb}_{20}\text{Se}_{60}(\text{In}_{x3}\text{Sr}_{y3})_5$, $\text{Ge}_{20}\text{Sb}_{20}\text{Se}_{60}(\text{In}_{x3}\text{Sr}_{y3})_{10}$, $\text{Ge}_{20}\text{Sb}_{20}\text{Se}_{60}(\text{In}_{x3}\text{Si}_{y3})_5$, $\text{Ge}_{20}\text{Sb}_{20}\text{Se}_{60}(\text{In}_{x3}\text{Si}_{y3})_{10}$, $\text{Ge}_{20}\text{Sb}_{20}\text{Se}_{60}(\text{Al}_{x3}\text{Sr}_{y3})_5$, $\text{Ge}_{20}\text{Sb}_{20}\text{Se}_{60}(\text{Al}_{x3}\text{Sr}_{y3})_{10}$, $\text{Ge}_{20}\text{Sb}_{20}\text{Se}_{60}(\text{Al}_{x3}\text{Si}_{y3})_5$, $\text{Ge}_{20}\text{Sb}_{20}\text{Se}_{60}(\text{Al}_{x3}\text{Si}_{y3})_{10}$, $\text{Ge}_{20}\text{Sb}_{20}\text{Se}_{60}(\text{Sr}_{x3}\text{Si}_{y3})_5$, $\text{Ge}_{20}\text{Sb}_{20}\text{Se}_{60}(\text{Sr}_{x3}\text{Si}_{y3})_{10}$, $\text{Ge}_{20}\text{Sb}_{20}\text{Se}_{60}(\text{In}_{x2}\text{O}_{y2})_5$, $\text{Ge}_{20}\text{Sb}_{20}\text{Se}_{60}(\text{In}_{x2}\text{O}_{y2})_{10}$, $\text{Ge}_{20}\text{Sb}_{20}\text{Se}_{60}(\text{Al}_{x2}\text{O}_{y2})_5$, $\text{Ge}_{20}\text{Sb}_{20}\text{Se}_{60}(\text{Al}_{x2}\text{O}_{y2})_{10}$, $\text{Ge}_{20}\text{Sb}_{20}\text{Se}_{60}(\text{Sr}_{x2}\text{O}_{y2})_5$, $\text{Ge}_{20}\text{Sb}_{20}\text{Se}_{60}(\text{Sr}_{x2}\text{O}_{y2})_{10}$, $\text{Ge}_{20}\text{Sb}_{20}\text{Se}_{60}(\text{Si}_{x2}\text{O}_{y2})_5$, $\text{Ge}_{20}\text{Sb}_{20}\text{Se}_{60}(\text{Si}_{x2}\text{O}_{y2})_{10}$, $\text{Ge}_{20}\text{Sb}_{20}\text{Se}_{60}(\text{In}_{x2}\text{N}_{y2})_5$, $\text{Ge}_{20}\text{Sb}_{20}\text{Se}_{60}(\text{In}_{x2}\text{N}_{y2})_{10}$, $\text{Ge}_{20}\text{Sb}_{20}\text{Se}_{60}(\text{Al}_{x2}\text{N}_{y2})_5$, $\text{Ge}_{20}\text{Sb}_{20}\text{Se}_{60}(\text{Al}_{x2}\text{N}_{y2})_{10}$, $\text{Ge}_{20}\text{Sb}_{20}\text{Se}_{60}(\text{Sr}_2\text{N}_{y2})_5$, $\text{Ge}_{20}\text{Sb}_{20}\text{Se}_{60}(\text{Sr}_2\text{N}_{y2})_{10}$, $\text{Ge}_{20}\text{Sb}_{20}\text{Se}_{60}(\text{Si}_{x2}\text{N}_{y2})_5$, and $\text{Ge}_{20}\text{Sb}_{20}\text{Se}_{60}(\text{Si}_{x2}\text{N}_{y2})_{10}$, wherein 30 at %≤x2≤70 at %, 30 at %≤y2≤70 at %, and x2+y2=100 at %, and wherein 0 at %<x3<100 at %, 0 at %<y3<100 at %, and x3+y3=100 at %.

21. The memory device of claim 16, wherein the chalcogenide-based switching material is an amorphous material in which at least some Se—Se homopolar bonds are substituted with Se-M bonds, and wherein M is a metal or metalloid element of In, Al, Sr, or Si.

22. The memory device of claim 16, wherein the variable resistance layer comprises a chalcogenide-based material having a different composition from a composition of the chalcogenide-based switching material.

23. The memory device of claim 16, wherein the memory device has a reduced threshold voltage drift compared to a memory device including a chalcogenide switching material consisting of Ge, Sb, and Se, and wherein, in the chalcogenide-based switching material, the amount of Sb is greater than or equal to 20 at % and less than or equal to 50 at %.

24. The memory device of claim 16, further comprising: a third electrode layer between the switching material layer and the variable resistance layer.

25. A memory device comprising: a first electrode line layer including a plurality of first electrode lines that extend in a first direction and are spaced apart each other; a second electrode line layer on the first electrode line layer and including a plurality of second electrode lines that extend in a second direction and are spaced apart from each other, the second direction being different than the first direction, and the plurality of first electrode lines and the plurality of second electrode lines crossing each other to form a plurality of intersections; and a plurality of memory cells electrically connected between the plurality of first electrode lines and the plurality of second electrode lines at intersections thereof, wherein the plurality of memory cells each include a variable resistance layer and a switching material layer electrically connected to the variable resistance layer, the switching material layer includes a chalcogenide-based switching material, the chalcogenide-based switching material includes a chalcogenide material including Ge, Sb, Se, and a dopant, and the dopant includes a metal or metalloid element selected from In, Al, Sr, and Si, an oxide of the metal or metalloid element, or a nitride of the metal or metalloid element, wherein, in the chalcogenide-based switching material, an amount of Ge is greater than or equal to 10 at % and less than or equal to 40 at %, an amount of Sb is greater than 20 at % and less than or equal to 50 at %, an amount of Se is greater than or equal to 30 at % and less than or equal to 80 at %, and an amount of the dopant is greater than 0% and less than the amount of Se, and wherein at % refers to atomic percentage.

26. The memory device of claim 25, wherein the chalcogenide-based switching material comprises a compound represented by Formula 1:

$$\text{Ge}_a\text{Sb}_b\text{Se}_c\text{M}_d \qquad \text{[Formula 1]}$$

wherein, in Formula 1,

M is at least one metal or metalloid element selected from In, Al, Sr, and Si, 10 at %≤a≤40 at %, 20 at %≤b≤50 at %, 30 at %≤c≤80 at %, 0.5 at %≤ d≤10 at %, and a+b+c+d=100 at %.

27. The memory device of claim 25, wherein the chalcogenide-based switching material comprises a compound represented by Formula 2:

$$\text{Ge}_{a1}\text{Sb}_{b1}\text{Se}_{c1}(\text{M1}_x\text{O}_y)_{d1} \qquad \text{[Formula 2]}$$

wherein, in Formula 2,

M1 is at least one metal or metalloid element selected from In, Al, Sr, and Si, 10 at %≤a1≤40 at %, 20 at %≤b1≤50 at %, 30 at %≤c1≤80 at %, 0.5 at %≤d1≤10 at %, 30 at %≤x≤70 at %, 30 at %≤y≤70 at %, a1+b1+c1+d1=100 at %, and x+y=100 at %.

28. The memory device of claim 25, wherein the chalcogenide-based switching material comprises a compound represented by Formula 3:

$$\text{Ge}_{a2}\text{Sb}_{b2}\text{Se}_{c2}(\text{M2}_{x1}\text{N}_{y1})_{d2} \qquad \text{[Formula 3]}$$

wherein, in Formula 3,

M2 is at least one metal or metalloid element selected from In, Al, Sr, and Si, 10 at %≤a2≤40 at %, 20 at %≤b2≤50 at %, 30 at %≤c2≤80 at %, 0.5 at %≤d2≤10 at %, 30 at %≤x1≤70 at %, 30 at %≤y1≤70 at %, a2+b2+c2+d2=100 at %, and x1+y1=100 at %.

29. The memory device of claim 25, wherein the chalcogenide-based switching material comprises at least one selected from $\text{Ge}_{20}\text{Sb}_{20}\text{Se}_{60}\text{In}_5$, $\text{Ge}_{20}\text{Sb}_{20}\text{Se}_{60}\text{In}_{10}$, $\text{Ge}_{20}\text{Sb}_{20}\text{Se}_{60}\text{Al}_5$, $\text{Ge}_{20}\text{Sb}_{20}\text{Se}_{60}\text{Al}_{10}$, $\text{Ge}_{20}\text{Sb}_{20}\text{Se}_{60}\text{Sr}_5$,

23

$Ge_{20}Sb_{20}Se_{60}Sr_{10}$,
$Ge_{20}Sb_{20}Se_{60}Si_{10}$,
$Ge_{20}Sb_{20}Se_{60}(In_{x3}Al_{y3})_{10}$,
$Ge_{20}Sb_{20}Se_{60}(In_{x3}Sr_{y3})_{10}$,
$Ge_{20}Sb_{20}Se_{60}(In_{x3}Si_{y3})_{10}$,
$Ge_{20}Sb_{20}Se_{60}(Al_{x3}Sr_{y3})_{10}$,
$Ge_{20}Sb_{20}Se_{60}(Al_{x3}Si_{y3})_{10}$,
$Ge_{20}Sb_{20}Se_{60}(Sr_{x3}Si_{y3})_{10}$,
$Ge_{20}Sb_{20}Se_{60}(In_{x2}O_{y2})_{10}$,
$Ge_{20}Sb_{20}Se_{60}(Al_{x2}O_{y2})_{10}$,
$Ge_{20}Sb_{20}Se_{60}(Sr_{x2}O_{y2})_{10}$,
$Ge_{20}Sb_{20}Se_{60}(Si_{x2}O_{y2})_{10}$,
$Ge_{20}Sb_{20}Se_{60}(In_{x2}N_{y2})_{10}$,
$Ge_{20}Sb_{20}Se_{60}(Al_{x2}N_{y2})_{10}$,
$Ge_{20}Sb_{20}Se_{60}(Sr_{x2}N_{y2})_{10}$, $Ge_{20}Sb_{20}Se_{60}(Si_{x2}N_{y2})_{10}$, $Ge_{20}Sb_{20}Se_{60}Si_5$,
$Ge_{20}Sb_{20}Se_{60}(In_{x3}Al_{y3})_5$,
$Ge_{20}Sb_{20}Se_{60}(In_{x3}Sr_{y3})_5$,
$Ge_{20}Sb_{20}Se_{60}(In_{x3}Si_{y3})_5$,
$Ge_{20}Sb_{20}Se_{60}(Al_{x3}Sr_{y3})_5$,
$Ge_{20}Sb_{20}Se_{60}(Al_{x3}Si_{y3})_5$,
$Ge_{20}Sb_{20}Se_{60}(Sr_{x3}Si_{y3})_5$,
$Ge_{20}Sb_{20}Se_{60}(In_{x2}O_{y2})_5$,
$Ge_{20}Sb_{20}Se_{60}(Al_{x2}O_{y2})_5$,
$Ge_{20}Sb_{20}Se_{60}(Sr_{x2}O_{y2})_5$,
$Ge_{20}Sb_{20}Se_{60}(Si_{x2}O_{y2})_5$,
$Ge_{20}Sb_{20}Se_{60}(In_{x2}N_{y2})_5$,
$Ge_{20}Sb_{20}Se_{60}(Al_{x2}N_{y2})_5$,
$Ge_{20}Sb_{20}Se_{60}(Sr_2N_{y2})_5$, $Ge_{20}Sb_{20}Se_{60}(Si_{x2}N_{y2})_5$, and wherein 30 at % $\leq$ x2 $\leq$ 70 at %, 30 at % $\leq$ y2 $\leq$ 70 at %, and x2+y2=100 at %, and wherein 0 at % < x3 < 100 at %, 0 at % < y3 < 100 at %, and x3+y3=100 at %.

30. The memory device of claim 25,
wherein the chalcogenide-based switching material is an amorphous material in which at least some Se—Se homopolar bonds are substituted with Se-M bonds, wherein M is a metal or metalloid element of In, Al, Sr, or Si.

31. The memory device of claim 25,
wherein the variable resistance layer comprises a chalcogenide-based material having a different composition from a composition of the chalcogenide-based switching material.

32. The memory device of claim 25,
wherein the chalcogenide-based switching material is a material having a reduced threshold voltage drift compared to a chalcogenide material consisting of Ge, Sb, and Se, and
wherein, in the chalcogenide-based switching material, the amount of Sb is greater than or equal to 20 at % and less than or equal to 50 at %.

33. The memory device of claim 25, further comprising:
a plurality of insulating structures between the plurality of memory cells, wherein
the plurality of insulating structures each cover a sidewall a sidewall of a corresponding one of the plurality of memory cells.

34. The memory device of claim 25, further comprising:
a third electrode line layer on the second electrode line layer, wherein
the third electrode line layer includes a plurality of third electrode lines.

* * * * *